(12) United States Patent
Kim et al.

(10) Patent No.: US 10,134,486 B2
(45) Date of Patent: Nov. 20, 2018

(54) MEMORY DEVICE INCLUDING A REDUNDANCY COLUMN AND A REDUNDANCY PERIPHERAL LOGIC CIRCUIT

(71) Applicant: SAMSUNG ELECTRONICS CO., LTD., Suwon-si, Gyeonggi-Do (KR)

(72) Inventors: Hoonki Kim, Seoul (KR); Yongho Kim, Seoul (KR); Changnam Park, Seoul (KR); Taejoong Song, Seongnam-si (KR); Woojin Rim, Hwaseong-si (KR); Jonghoon Jung, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/699,412

(22) Filed: Sep. 8, 2017

(65) Prior Publication Data

US 2018/0075929 A1 Mar. 15, 2018

(30) Foreign Application Priority Data

Sep. 13, 2016 (KR) .................. 10-2016-0118062
Jun. 7, 2017 (KR) .................. 10-2017-0070958

(51) Int. Cl.
*G11C 29/00* (2006.01)
*G11C 7/10* (2006.01)
*G11C 29/26* (2006.01)
*G11C 5/02* (2006.01)

(52) U.S. Cl.
CPC .......... *G11C 29/702* (2013.01); *G11C 7/1012* (2013.01); *G11C 29/26* (2013.01); *G11C 29/76* (2013.01); *G11C 5/025* (2013.01); *G11C 29/838* (2013.01)

(58) Field of Classification Search
CPC ....... G11C 29/702; G11C 29/26; G11C 29/76; G11C 29/781; G11C 29/808; G11C 29/838; G11C 5/025; G11C 7/1012
USPC .. 365/189.02, 63, 185.02, 185.09, 200, 201, 365/230.02
See application file for complete search history.

(56) References Cited

U.S. PATENT DOCUMENTS 4,459,685 A * 7/1984 Sud .................. G11C 29/84
                                                    365/200
4,829,480 A * 5/1989 Seo .................. G11C 29/80
                                                    365/200
5,257,229 A * 10/1993 McClure ............... G11C 29/846
                                                    326/106

(Continued)

*Primary Examiner* — Tan T. Nguyen
(74) *Attorney, Agent, or Firm* — F. Chau & Associates, LLC

(57) ABSTRACT

A memory device includes a memory cell array including a plurality of memory cells arranged in a plurality of columns including a normal column and a redundancy column for repairing the normal column, a plurality of peripheral logic circuits including a normal peripheral logic circuit and a redundancy peripheral logic circuit for repairing the normal peripheral logic circuit, and a first path selection logic circuit configured to form first paths between the plurality of columns and the plurality of peripheral logic circuits, based on at least one defect from among a defect in at least one of the plurality of columns or a defect in at least one of the plurality of peripheral logic circuits.

20 Claims, 15 Drawing Sheets

(56) References Cited

U.S. PATENT DOCUMENTS

| | | | | |
|---|---|---|---|---|
| 5,293,348 | A * | 3/1994 | Abe | G11C 29/808 365/200 |
| 5,297,085 | A * | 3/1994 | Choi | G11C 29/808 365/200 |
| 5,416,740 | A | 5/1995 | Fujita et al. | |
| 5,430,679 | A * | 7/1995 | Hiltebeitel | G11C 29/785 365/200 |
| 5,446,692 | A * | 8/1995 | Haraguchi | G11C 29/808 365/200 |
| 5,920,514 | A | 7/1999 | Lim et al. | |
| 7,152,187 | B2 | 12/2006 | Tran et al. | |
| 7,577,882 | B2 | 8/2009 | Kurumada et al. | |
| 8,004,912 | B2 | 8/2011 | Terzioglu et al. | |
| 8,542,545 | B2 | 9/2013 | Loh et al. | |
| 8,597,960 | B2 | 12/2013 | Bernstein et al. | |
| 8,937,845 | B2 | 1/2015 | Verma et al. | |
| 9,230,691 | B1 | 1/2016 | Boynapalli et al. | |
| 2009/0303815 | A1* | 12/2009 | Yu | G11C 29/44 365/200 |

* cited by examiner

MEMORY DEVICE INCLUDING A REDUNDANCY COLUMN AND A REDUNDANCY PERIPHERAL LOGIC CIRCUIT

CROSS-REFERENCE TO RELATED APPLICATIONS

This application claims priority under 35 U.S.C. 119 to Korean Patent Application Nos. 10-2016-0118062, filed on Sep. 13, 2016, and 10-2017-0070958, filed on Jun. 7, 2017, in the Korean Intellectual Property Office, the disclosures of which are incorporated by reference herein in their entireties.

TECHNICAL FIELD

Exemplary embodiments of the inventive concept relate to a memory device, and more particularly, to a memory device including a redundancy column and a redundancy peripheral logic circuit.

DISCUSSION OF RELATED ART

A semiconductor memory device may include a memory cell array composed of memory cells having different states according to stored data therein, and a peripheral circuit for driving the semiconductor memory device. The semiconductor memory device may be, for example, static random access memory (SRAM) for storing data using a latch, or dynamic random access memory (DRAM) for storing data using a capacitor. SRAM has a lower integration density and a smaller memory capacity than DRAM, but for a peripheral circuit having a relatively simple configuration and operating at a relatively high speed, SRAM may be mainly used for cache memory or the like.

SUMMARY

According to an exemplary embodiment of the inventive concept, a memory device includes a memory cell array including a plurality of memory cells arranged in a plurality of columns including a normal column and a redundancy column for repairing the normal column, a plurality of peripheral logic circuits including a normal peripheral logic circuit and a redundancy peripheral logic circuit for repairing the normal peripheral logic circuit, and a first path selection logic circuit configured to form first paths between the plurality of columns and the plurality of peripheral logic circuits, based on at least one defect from among a defect in at least one of the plurality of columns or a defect in at least one of the plurality of peripheral logic circuits.

According to an exemplary embodiment of the inventive concept, a memory device includes a memory cell array including a plurality of memory cells arranged in a plurality of columns including a normal column and a redundancy column for repairing the normal column, a plurality of peripheral logic circuits including a normal peripheral logic circuit and a redundancy peripheral logic circuit for repairing the normal peripheral logic circuit, and a path control logic circuit configured to output a path control signal determining first paths formed between the plurality of columns and the plurality of peripheral logic circuits, based on at least one defect from among a defect in at least one of the plurality of columns or a defect in at least one of the plurality of peripheral logic circuits.

According to an exemplary embodiment of the inventive concept, for a method of operating a memory device, the memory device includes a memory cell array, a path selection logic circuit, and a plurality of peripheral logic circuits, where the memory cell array includes a plurality of column groups and the path selection logic circuit includes a plurality of multiplexers, and each of the plurality of multiplexers is configured to select an input from one of at least two of the plurality of column groups and output to one of the plurality of peripheral logic circuits. The method includes checking for a defect in a first peripheral logic circuit among the plurality of peripheral logic circuits, controlling the plurality of multiplexers to adjust input selections thereof when it is determined that there is a defect in the first peripheral logic circuit, checking for a defect in a first column group among the plurality of column groups, and controlling the plurality of multiplexers to adjust the input selections thereof when it is determined that there is a defect in the first column group.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
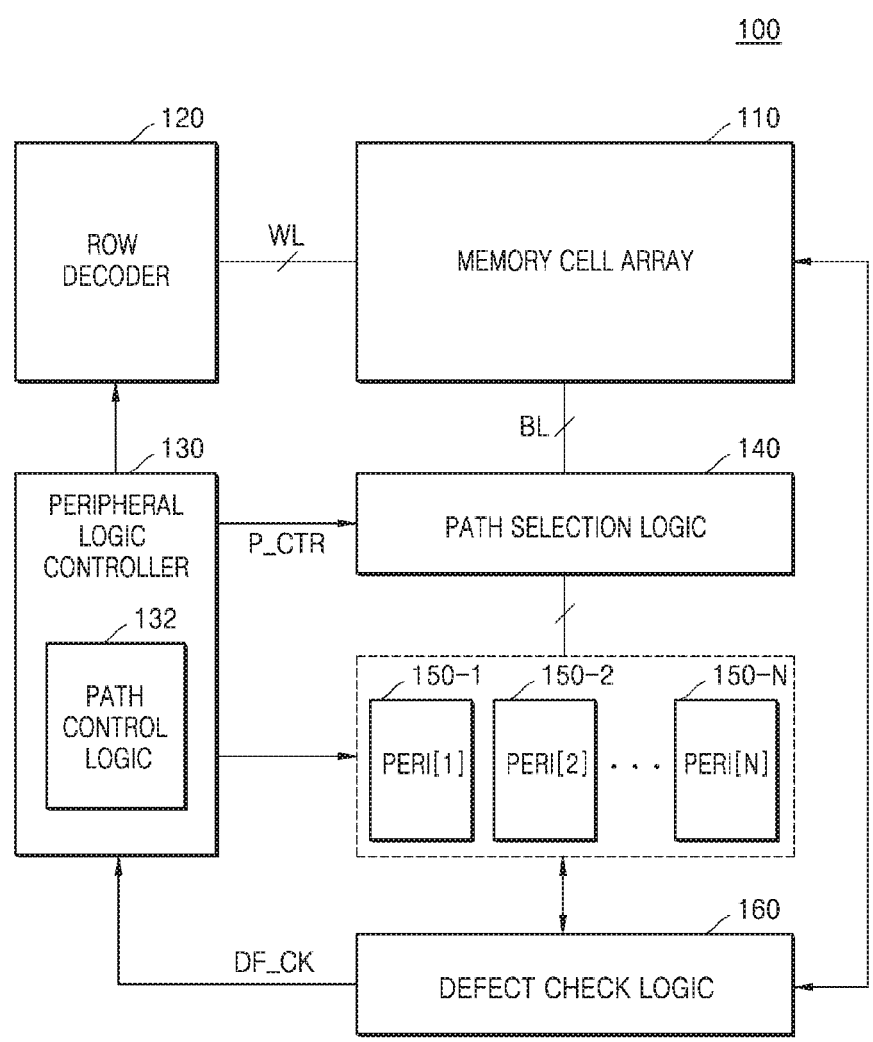
FIG. 1 is a block diagram of a memory device according to an exemplary embodiment of the inventive concept.

Exemplary embodiments of the inventive concept provide a memory device including a redundancy column and a redundancy peripheral logic circuit.

Exemplary embodiments of the inventive concept will be described more fully hereinafter with reference to the accompanying drawings. Like reference numerals may refer to like elements throughout this application.

FIG. 1 is a block diagram of a memory device according to an exemplary embodiment of the inventive concept. Referring to FIG. 1, a memory device 100 may include a memory cell array 110, a row decoder 120, a peripheral logic controller 130, a path selection logic circuit 140, a plurality of peripheral logic circuits 150-1 to 150-N, and a defect check logic circuit 160.

The memory cell array 110 may include a plurality of memory cells connected to a plurality of word lines WL and a plurality of bit lines BL. Each of the plurality of memory cells may be accessed via one of the plurality of word lines WL and one of the plurality of bit lines BL. Each of the plurality of memory cells may be connected to a bit line pair by a word line voltage. For example, each of the plurality of memory cells may include a latch circuit and pass transistors that receive the word line voltage as a gate voltage. When a data read operation starts, the bit line pair may be precharged, and subsequently, in a sensing operation for the memory cell array 110, a voltage of the precharged bit line pair may be changed according to data stored in the latch circuit. The data may be read by sensing the voltage change during the sensing operation.

The plurality of memory cells included in the memory cell array 110 may be volatile memory cells that lose stored data when supplied power is interrupted, or may be nonvolatile memory cells that maintain stored data even if the supplied power is interrupted. For example, when the plurality of memory cells are volatile memory cells, the memory device 100 may be Dynamic Random Access Memory (DRAM), Static Random Access Memory (SRAM), mobile DRAM, Double Data Rate Synchronous Dynamic Random Access Memory (DDR SDRAM), Low Power DDR (LPDDR) SDRAM, Graphic DDR (GDDR) SDRAM, or Rambus Dynamic Random Access Memory (RDRAM). On the other hand, when the plurality of memory cells are nonvolatile memory cells, the memory device 100 may be Electrically Erasable Programmable Read-Only Memory (EEPROM), a flash memory, Phase Change Random Access Memory (PRAM), Resistance Random Access Memory (RRAM), Nano Floating Gate Memory (NFGM), Polymer Random Access Memory (PoRAM), Magnetic Random Access Memory (MRAM), or Ferroelectric Random Access Memory (FRAM). Alternatively, the memory device 100 may be a hybrid memory device in which the memory cell array 110 includes both volatile memory cells and nonvolatile memory cells.

In an exemplary embodiment of the inventive concept, the plurality of memory cells included in the memory cell array 110 may be arranged in a plurality of columns including a normal column and a redundancy column. The redundancy column may be an extra column for repairing the normal column. For example, if a defect occurs in one normal column, one redundancy column may form a data path with one of the plurality of peripheral logic circuits 150-1 to 150-N.

The plurality of columns included in the memory cell array 110 may be grouped into a plurality of column groups. In other words, each of the plurality of column groups may include at least one column. For example, a column group may refer to a unit that forms a path of data or signals with one of the plurality of peripheral logic circuits 150-1 to 150-N.

The row decoder 120 may select at least one of the plurality of word lines WL in response to an address provided from an external device (e.g., a host, a memory controller, a memory interface, etc.). The row decoder 120 may transmit a voltage for performing a required operation to the selected word line.

The peripheral logic controller 130 may control all operations of the memory device 100 in response to control signals and/or addresses received from the external device. For example, the peripheral logic controller 130 may control each operation of the row decoder 120, the path selection logic circuit 140, and/or the plurality of peripheral logic circuits 150-1 to 150-N.

The peripheral logic controller 130 may include a path control logic circuit 132. In an exemplary embodiment of the inventive concept, the path control logic circuit 132 may output a path control signal P_CTR that controls the path selection logic circuit 140 based on a defect check signal DF_CK output from the defect check logic circuit 160. In an exemplary embodiment of the inventive concept, the path control logic circuit 132 may determine first paths formed between the plurality of columns included in the memory cell array 110 and the plurality of peripheral logic circuits 150-1 to 150-N, based on the defect check signal DF_CK. The first paths may be, for example, paths of data or signals between the plurality of columns and the plurality of peripheral logic circuits 150-1 to 150-N.

The path selection logic circuit 140 may form the first paths between the plurality of columns included in the memory cell array 110 and the plurality of peripheral logic circuits 150-1 to 150-N, based on the path control signal P_CTR output from the path control logic circuit 132. In an exemplary embodiment of the inventive concept, the path selection logic circuit 140 may form, as at least a portion of the first paths, one of paths formed between first columns from among the plurality of columns and a first peripheral logic circuit from among the plurality of peripheral logic circuits 150-1 to 150-N, paths formed between the first columns and a second peripheral logic circuit adjacent to one side of the first peripheral logic circuit, and paths formed between the first columns and a third peripheral logic circuit adjacent to the other side of the first peripheral logic circuit.

In an exemplary embodiment of the inventive concept, the path selection logic circuit 140 may include a plurality of multiplexers connected between the plurality of columns and the plurality of peripheral logic circuits 150-1 to 150-N. In an exemplary embodiment of the inventive concept, the path selection logic circuit 140 may include a plurality of switches connected between the plurality of columns and the plurality of peripheral logic circuits 150-1 to 150-N. However, the inventive concept is not limited thereto. For example, the path selection logic circuit 140 may include a shift register.

The plurality of peripheral logic circuits 150-1 to 150-N may include all control circuits for driving the plurality of bit lines BL of the memory cell array 110. For example, each of the plurality of peripheral logic circuits 150-1 to 150-N may include a sense amplifier for sensing a voltage change of a selected bit line and/or a write driver for writing data through the plurality of bit lines BL. However, the inventive concept is not limited thereto, and each of the plurality of peripheral logic circuits 150-1 to 150-N may further include a precharge circuit for precharging the selected bit line when a read operation is performed, or a pull-up/pull-down circuit for adjusting the selected bit line to an optimal level or to have a voltage higher than a minimum precharge voltage.

In an exemplary embodiment of the inventive concept, each of the plurality of peripheral logic circuits 150-1 to 150-N may include a detour circuit that is controlled by the defect check logic circuit 160, receives a detour signal from the defect check logic circuit 160, and outputs the received detour signal to at least one logic circuit included therein. In an exemplary embodiment of the inventive concept, the detour signal output by each of the detour circuits may be an index of a defect check for a corresponding one of the plurality of peripheral logic circuits 150-1 to 150-N.

For example, each of the detour circuits may be implemented in a form of a switch, a transmission gate, a metal-oxide-semiconductor field effect transistor (MOSFET), a fuse circuit, or the like. In other words, the detour circuits may be implemented in any form as long as they are capable of signal transmission.

In an exemplary embodiment of the inventive concept, each of the plurality of peripheral logic circuits 150-1 to 150-N may include a normal peripheral logic circuit and a redundancy peripheral logic circuit. The redundancy peripheral logic circuit may be an extra peripheral logic circuit for repairing the normal peripheral logic circuit. For example, when a defect occurs in one peripheral logic circuit, one redundant peripheral logic circuit may form a data path with one of the plurality of columns included in the memory cell array 110.

The defect check logic circuit 160 may check a defect in at least one of the plurality of columns included in the memory cell array 110 and a defect in at least one of the plurality of peripheral logic circuits 150-1 to 150-N, and may output the defect check signal DF_CK. In an exemplary embodiment of the inventive concept, the defect check logic circuit 160 may provide data to be written to at least one memory cell included in the memory cell array 110, and may receive data stored in the memory cell. In an exemplary embodiment of the inventive concept, the defect check logic circuit 160 may control the detour circuit included in each of the plurality of peripheral logic circuits 150-1 to 150-N. The defect check logic circuit 160 may also output the detour signal to the detour circuit included in each of the plurality of peripheral logic circuits 150-1 to 150-N. A detailed description thereof will be described below.

Figure 2A:
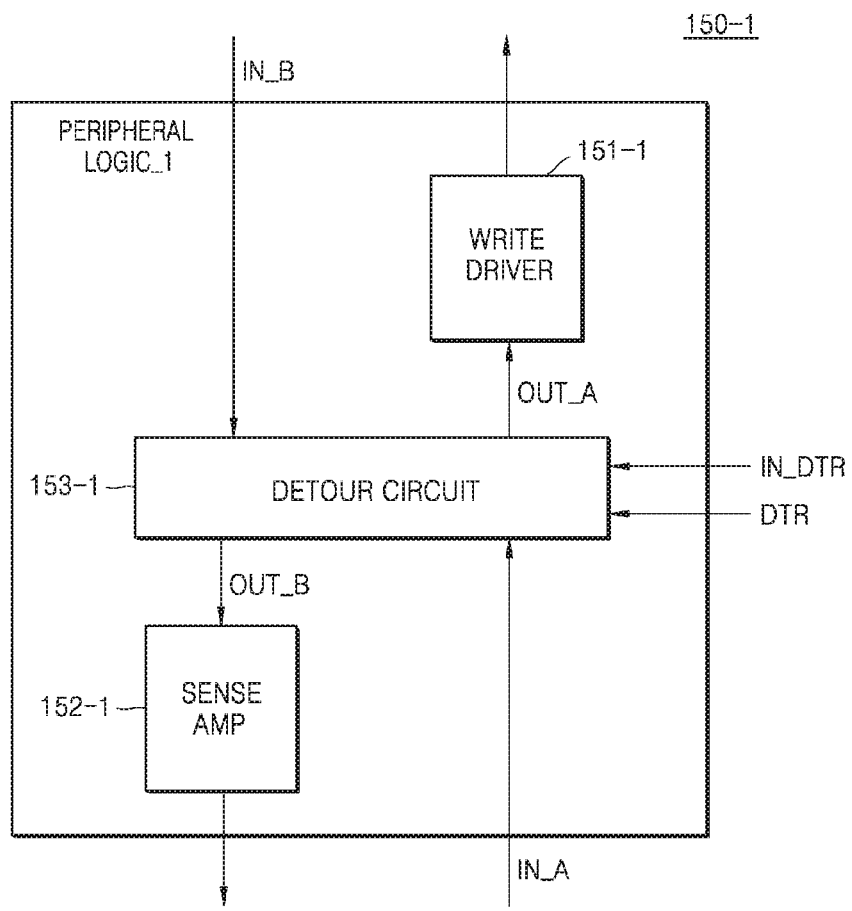
FIG. 2A is a block diagram of a configuration of a peripheral logic circuit included in the memory device of FIG. 1 according to an exemplary embodiment of the inventive concept.

FIG. 2A is a block diagram of a configuration of a peripheral logic circuit included in the memory device of FIG. 1 according to an exemplary embodiment of the inventive concept. The peripheral logic circuit of FIG. 2A may be, for example, the first peripheral logic circuit 150-1 from among the plurality of peripheral logic circuits 150-1 to 150-N shown in FIG. 1.

Referring to FIGS. 1 and 2A, the first peripheral logic circuit 150-1 may include a write driver 151-1, a sense amplifier 152-1, and a detour circuit 153-1. The write driver 151-1 may form a write path that writes data through one of the plurality of bit lines BL. The sense amplifier 152-1 may form a read path that senses a voltage change of one of the plurality of bit lines BL.

The detour circuit 153-1 may form a portion of the write path. In more detail, the detour circuit 153-1 may receive input data as a first input signal IN_A and output the received input data as a first output signal OUT_A to the write driver 151-1. The input data may be data input from outside the memory device 100 through, for example, a DQ circuit or the like.

In addition, the detour circuit 153-1 may form a portion of the read path. In more detail, the detour circuit 153-1 may receive output data as a second input signal IN_B and output the received output data as a second output signal OUT_B to the sense amplifier 152-1. The output data may be, for example, stored data output from a memory cell included in the memory cell array 110.

The detour circuit 153-1 may receive a detour control signal DTR and a detour signal IN_DTR from the defect check logic circuit 160. In an exemplary embodiment of the inventive concept, the detour circuit 153-1 may generate a detour path for the detour signal IN_DTR, the first output signal OUT_A, and the second output signal OUT_B based on the detour control signal DTR.

For example, when the detour control signal DTR is activated, the detour signal IN_DTR may be output as the first output signal OUT_A and the second output signal OUT_B, instead of a connection between the first input signal IN_A and the first output signal OUT_A and a connection between the second input signal IN_B and the second output signal OUT_B. The activated detour control signal DTR may have a high level. When the detour control signal DTR is deactivated, the first input signal IN_A and the first output signal OUT_A may again form a portion of the write path and the second input signal IN_B and the second output signal OUT_B may again form the read path.

Figure 2B:
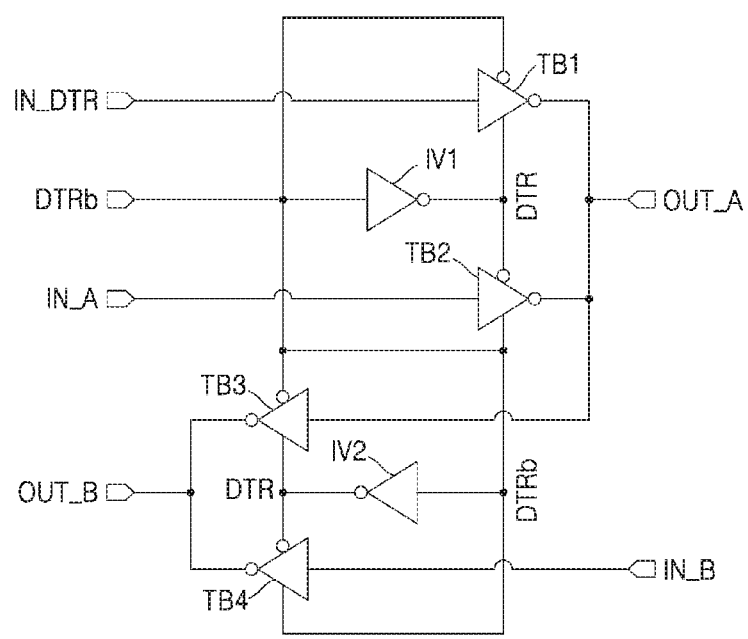
FIG. 2B is a circuit diagram of a detour circuit included in the peripheral logic circuit of FIG. 2A according to an exemplary embodiment of the inventive concept.

FIG. 2B is a circuit diagram of a detour circuit included in the peripheral logic circuit of FIG. 2A according to an exemplary embodiment of the inventive concept. The circuit diagram of FIG. 2B may be, for example, a circuit diagram of the detour circuit 153-1 shown in FIG. 2A.

Referring to FIG. 2B, the detour circuit 153-1 may include first to fourth tri-state buffers TB1 to TB4 and first and second inverters IV1 and IV2. The first and second tri-state buffers TB1 and TB2 may share an output terminal. The first output signal OUT_A may be output from the output terminal shared by the first and second tri-state buffers TB1 and TB2. The third and fourth tri-state buffers TB3 and TB4 may share an output terminal. The second output signal OUT_B may be output from the output terminal shared by the third and fourth tri-state buffers TB3 and TB4.

The first and second inverters IV1 and IV2 may receive a complementary detour control signal DTRb and output the detour control signal DTR. The complementary detour control signal DTRb may be in a complementary relationship with the detour control signal DTR.

The first tri-state buffer TB1 may receive the detour signal IN_DTR as an input. The second tri-state buffer TB2 may receive the first input signal IN_A as an input. The third tri-state buffer TB3 may receive the first output signal OUT_A as an input. The fourth tri-state buffer TB4 may receive the second input signal IN_B as an input.

When the detour control signal DTR is deactivated, the first and third tri-state buffers TB1 and TB3 may be in a deactivated state. Additionally, the second and fourth tri-state buffers TB2 and TB4 may be in an activated state. Thus, the detour circuit 153-1 may output the first input signal IN_A as the first output signal OUT_A and the second input signal IN_B as the second output signal OUT_B.

When the detour control signal DTR is activated, the first and third tri-state buffers TB1 and TB3 may be in an activated state. Additionally, the second and fourth tri-state buffers TB2 and TB4 may be in a deactivated state. Thus, the detour circuit 153-1 may output the detour signal IN_DTR as the first and second output signals OUT_A and OUT_B.

Figure 3:
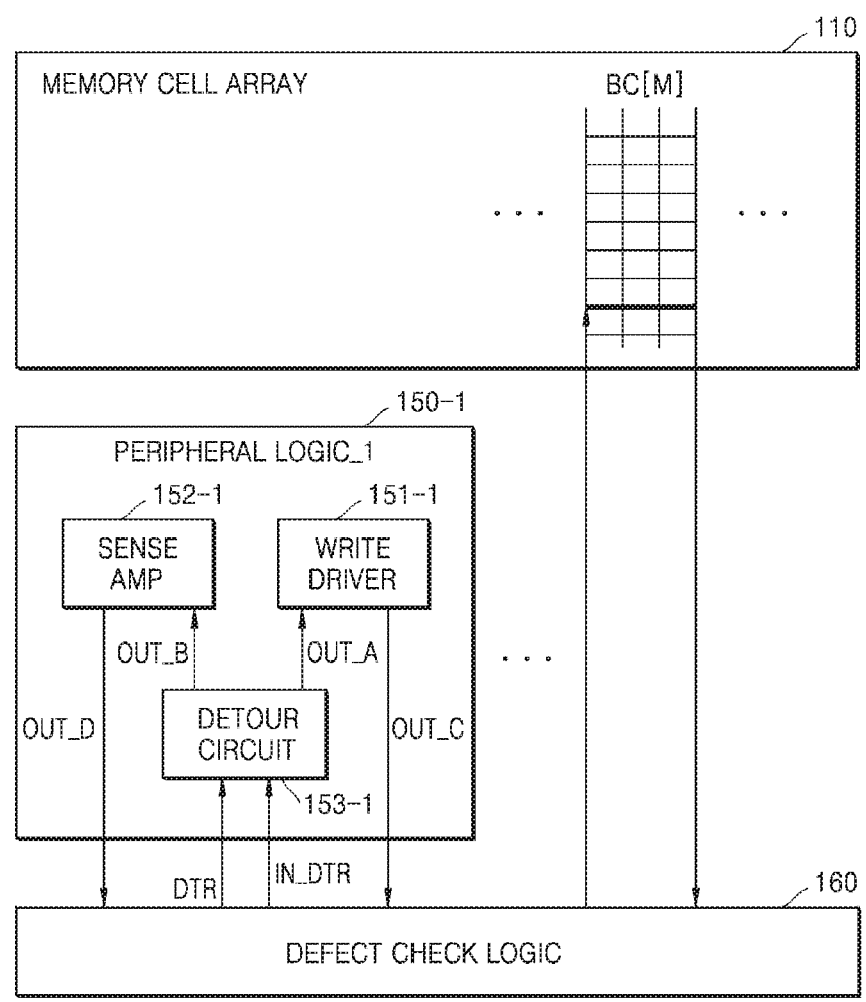
FIG. 3 is a view for explaining an operation of a defect check logic circuit included in the memory device of FIG. 1, according to an exemplary embodiment of the inventive concept.

FIG. 3 is a view for explaining an operation of a defect check logic circuit included in the memory device of FIG. 1, according to an exemplary embodiment of the inventive concept.

Referring to FIG. 3, the defect check logic circuit 160 may exchange data with the memory cell array 110. In addition, the defect check logic circuit 160 may exchange signals with the first peripheral logic circuit 150-1.

The defect check logic circuit 160 may check defects of a column group BC [M] included in the memory cell array 110. The defect check logic circuit 160 may check defects of the column group BC [M] by providing data to at least one memory cell included in a corresponding column and then receiving data output from the memory cell. For example, when the data provided to the memory cell by the defect check logic circuit 160 is different from the data output from the memory cell again, the defect check logic circuit 160 may determine that there are defects in the corresponding column including the memory cell.

The defect check logic circuit 160 may check defects in the first peripheral logic circuit 150-1. For example, the defect check logic circuit 160 may provide the detour signal IN_DTR and the detour control signal DTR to the detour circuit 153-1 included in the first peripheral logic circuit 150-1 to check defects in the first peripheral logic circuit 150-1.

The detour circuit 153-1 may output the received detour signal IN_DTR as the first and second output signals OUT_A and OUT_B based on the detour control signal DTR. The write driver 151-1 may receive the first output signal OUT_A and may output a third output signal OUT_C to the defect check logic circuit 160 based on the first output signal OUT_A. The sense amplifier 152-1 may also receive the second output signal OUT_B and output a fourth output signal OUT_D to the defect check logic circuit 160 based on the second output signal OUT_B.

The defect check logic circuit 160 may compare the detour signal IN_DTR with the third and fourth output signals OUT_C and OUT_D to check defects in the first peripheral logic circuit 150-1. In more detail, if at least one of the third and fourth output signals OUT_C and OUT_D is different from the detour signal IN_DTR, then the defect check logic circuit 160 may determine that there are defects in the first peripheral logic circuit 150-1.

Figure 4:
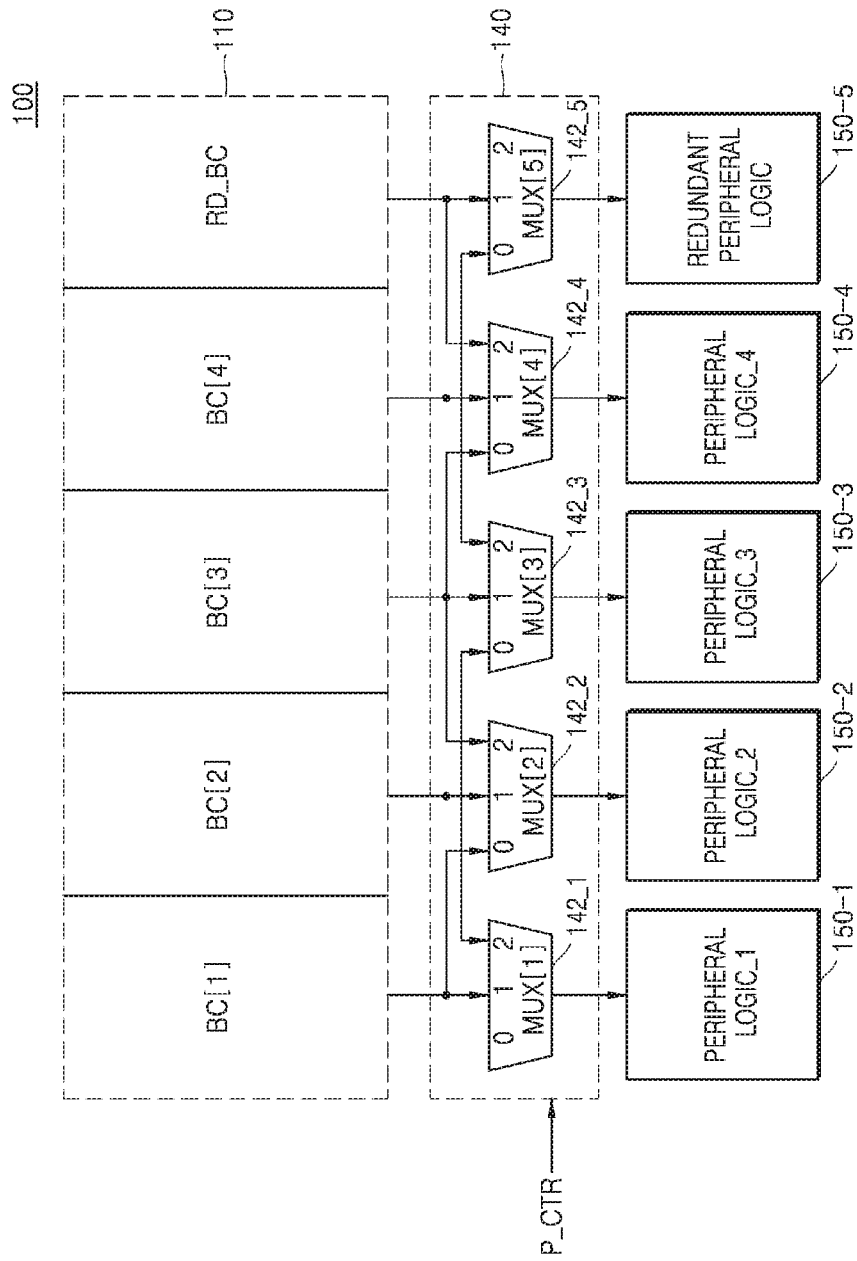
FIG. 4 is a block diagram of the memory device of FIG. 1 according to an exemplary embodiment of the inventive concept.

FIG. 4 is a block diagram of the memory device of FIG. 1 according to an exemplary embodiment of the inventive concept.

Referring to FIG. 4, the memory cell array 110 may include first to fourth column groups BC [1] to BC [4] and a redundancy column group RC_BC. The first to fourth column groups BC [1] to BC [4] may each include one or more normal columns. The redundancy column group RC_BC may include one or more redundancy columns. Although FIG. 4 shows four column groups and one redundancy column group, this is for convenience of explanation, and the number of column groups and redundancy column groups is not limited thereto.

The path selection logic circuit 140 may include first to fifth multiplexers 142_1 to 142_5. Each of the first to fifth multiplexers 142_1 to 142_5 may have one end connected to at least two column groups (BC [1] to BC [4] and RC_BC) and the other end connected to one of first to fourth peripheral logic circuits 150-1 to 150-4 or a redundancy peripheral logic circuit 150-5.

In an exemplary embodiment of the inventive concept, one end of the first multiplexer 142_1 may be connected to the first column group BC [1] and the second column group BC [2], and the other end may be connected to the first peripheral logic circuit 150-1. One end of the second multiplexer 142_2 may be connected to the first column group BC [1], the second column group BC [2], and the third column group BC [3], and the other end may be connected to the second peripheral logic circuit 150-2. One end of the third multiplexer 142_3 may be connected to the second column group BC [2], the third column group BC [3], and the fourth column group BC [4], and the other end may be connected to the third peripheral logic circuit 150-3. One end of the fourth multiplexer 142_4 may be connected to the third column group BC [3], the fourth column group BC [4], and the redundancy column group RD_BC, and the other end may be connected to the fourth peripheral logic circuit 150-4. One end of the fifth multiplexer 142_5 may be connected to the fourth column group BC [4] and the redundancy column group RD_BC, and the other end may be connected to the redundancy peripheral logic circuit 150-5.

In an exemplary embodiment of the inventive concept, the first to fifth multiplexers 142_1 to 142_5 may select one of the column groups connected thereto based on the path control signal P_CTR output from, for example, the path control logic circuit 132 of FIG. 1. For example, the path control signal P_CTR may include a plurality of bits for selection of each of the first to fifth multiplexers 142_1 to 142_5.

The memory device 100 may include the first to fourth peripheral logic circuits 150-1 to 150-4 and the redundancy peripheral logic circuit 150-5 connected to one of the first to fifth multiplexers 142_1 to 142_5. Although FIG. 4 shows four peripheral logic circuits and one redundancy peripheral logic circuit, this is for convenience of explanation, and the number of peripheral logic circuits and redundancy peripheral logic circuits is not limited thereto.

The memory device 100 according exemplary embodiments of the inventive concept may be capable of switching paths between column groups and peripheral logic circuits included in the memory cell array 110. Thus, when defects occur in at least one of the memory cell array 110 and the plurality of peripheral logic circuits 150-1 to 150-N, they may be independently repaired. Accordingly, efficiency of repairing the memory device 100 may be increased, and as a result, productivity of the memory device 100 may also be increased.

Figure 5A:
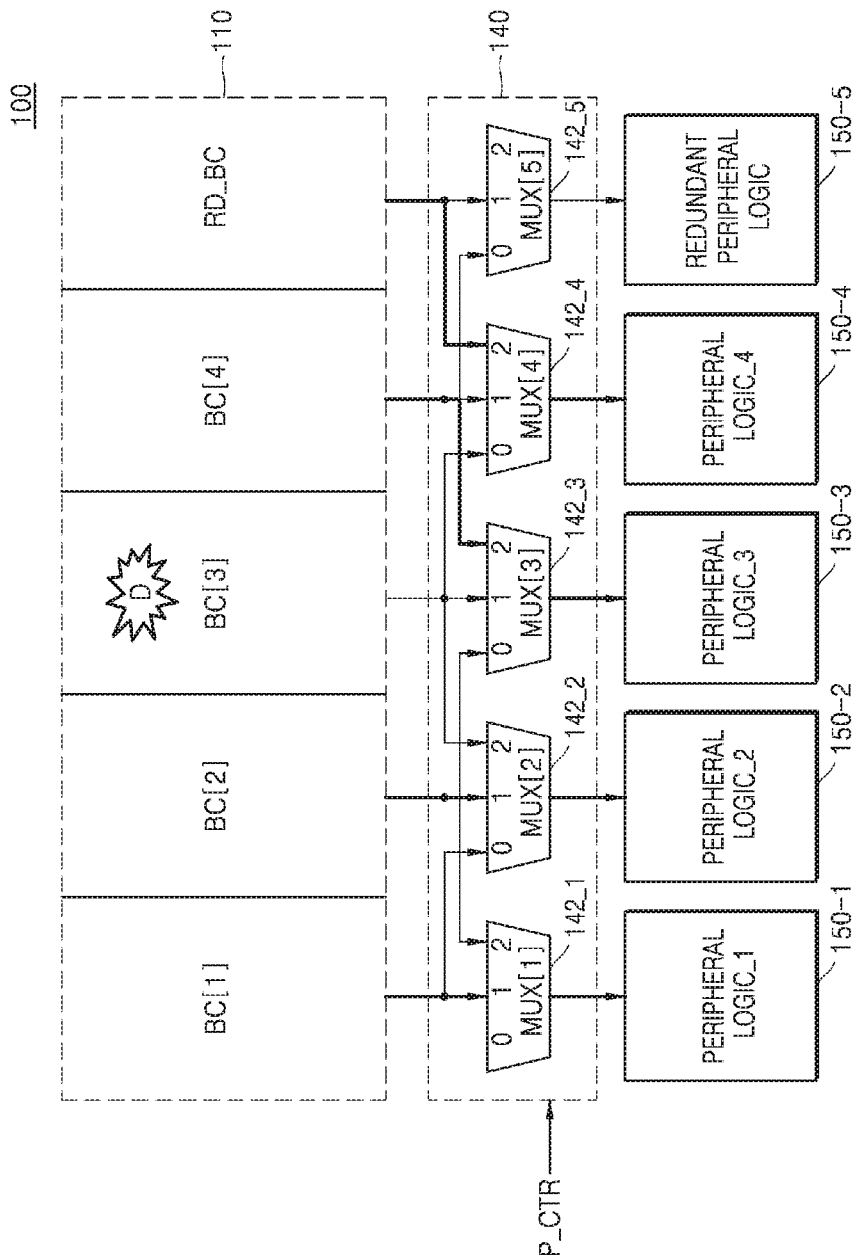
FIGS. 5A to 5D are views for explaining an operation of a path selection logic circuit of FIG. 4 when checking a defect, according to exemplary embodiments of the inventive concept.
Figure 5B:
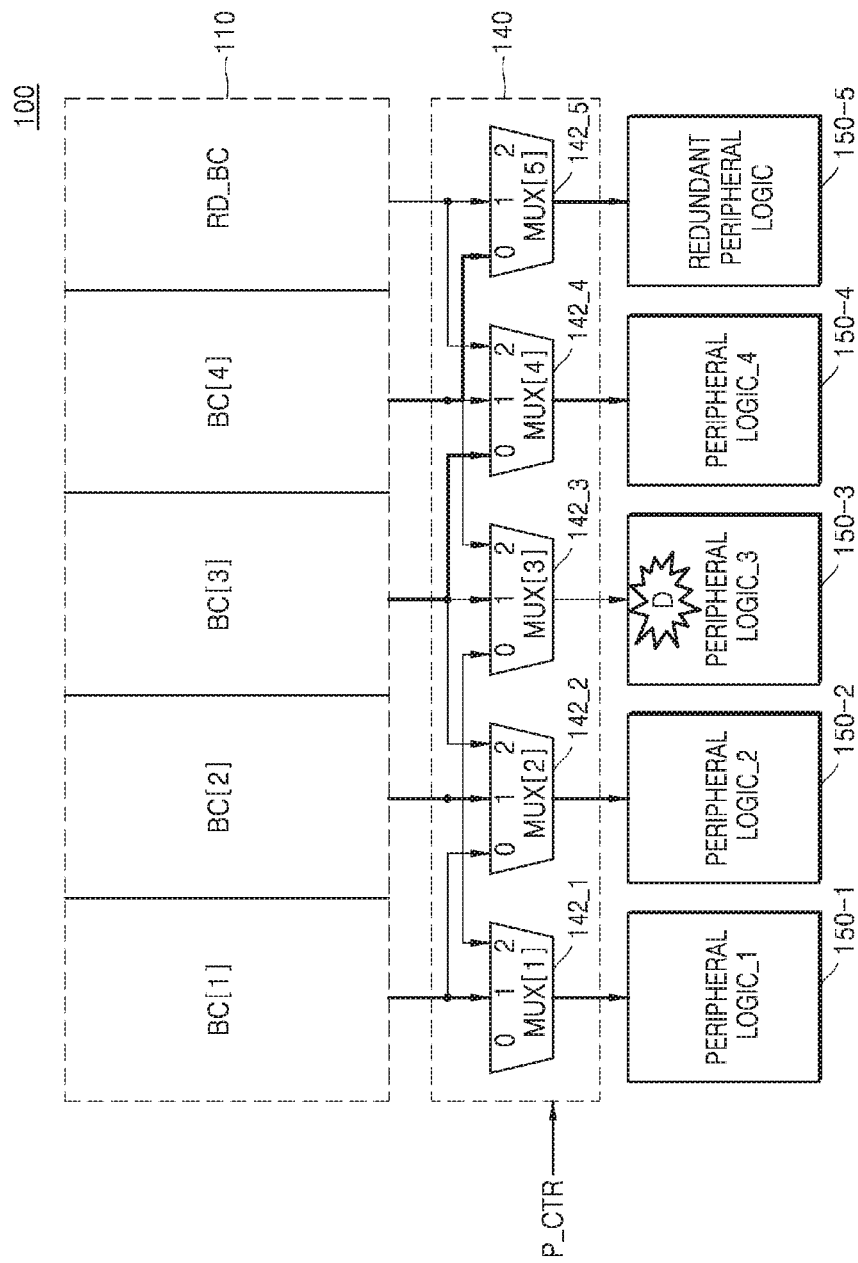
Figure 5C:
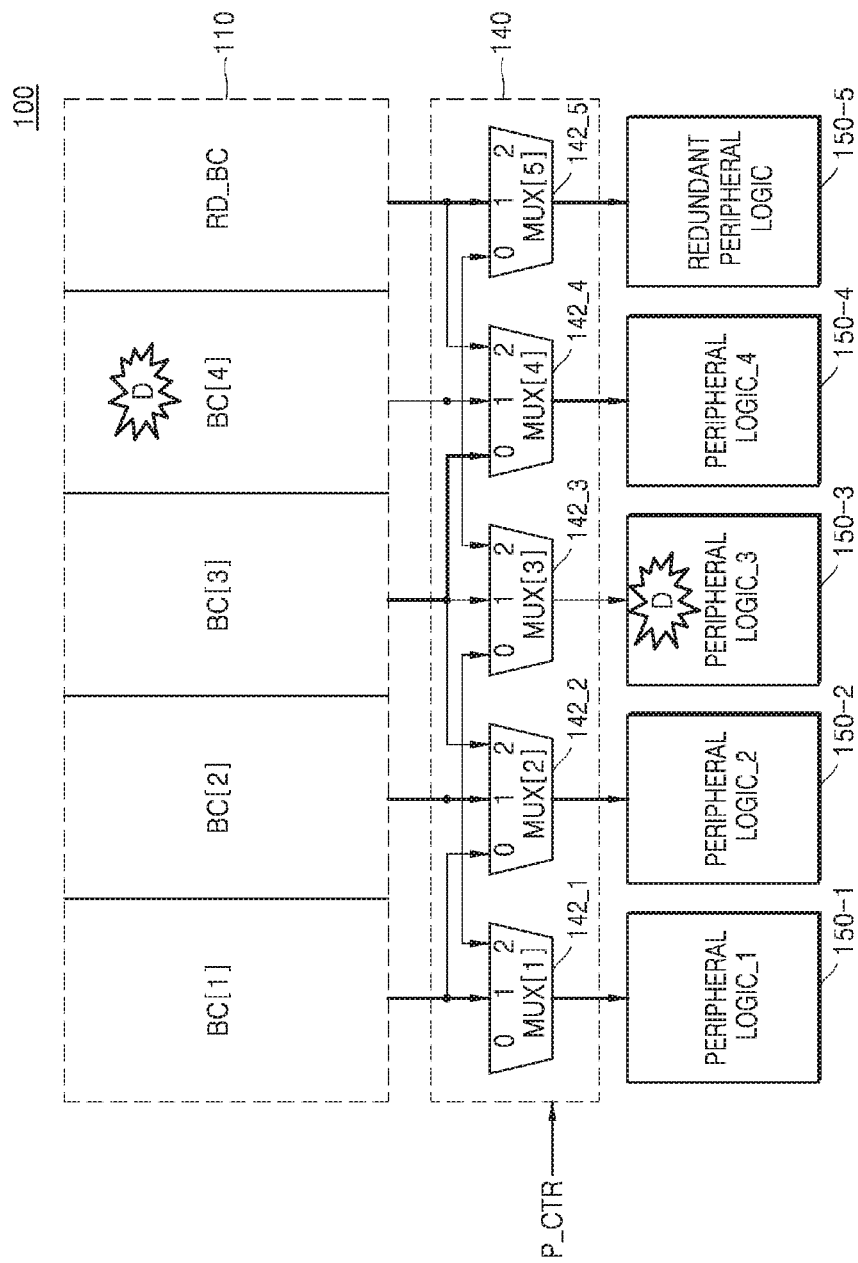
Figure 5D:
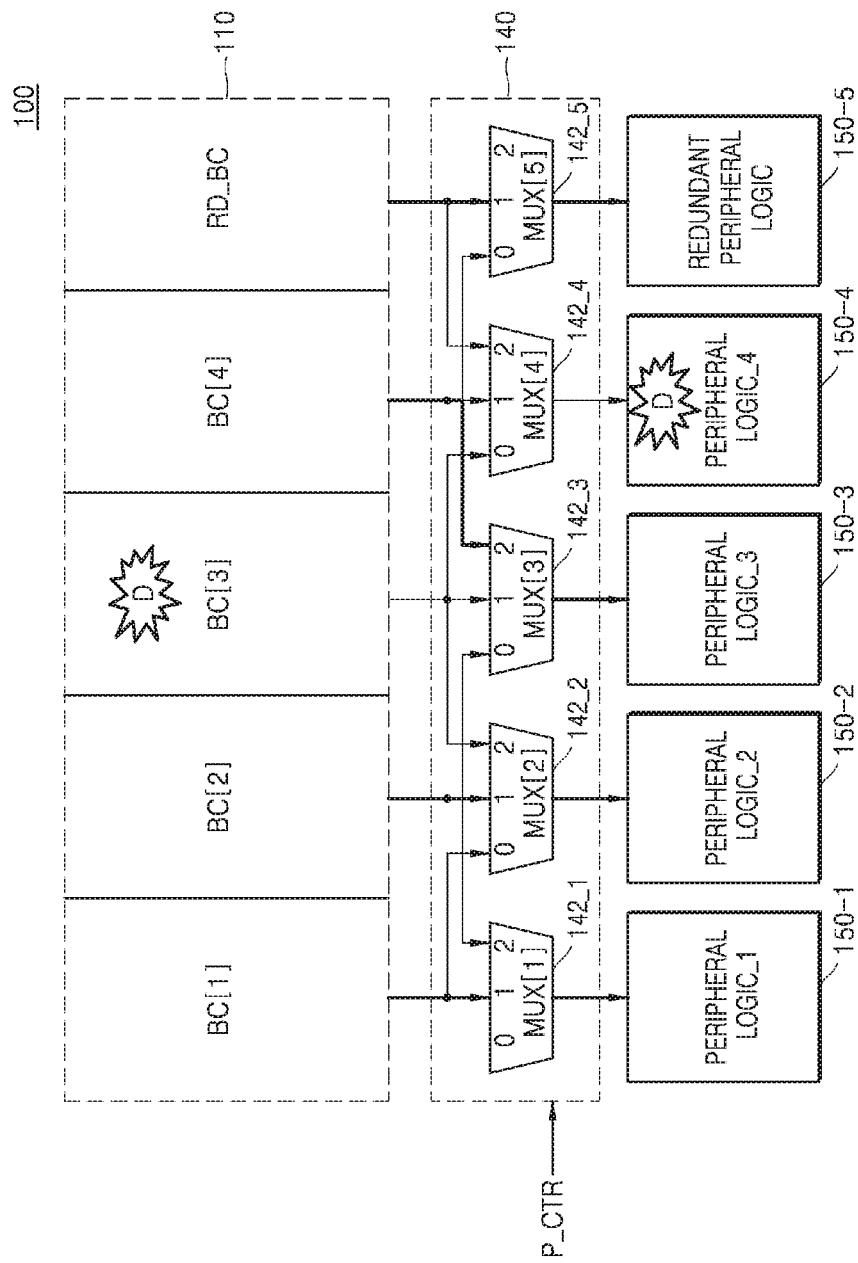

FIGS. 5A to 5D are views for explaining an operation of a path selection logic circuit of FIG. 4 when checking a defect, according to exemplary embodiments of the inventive concept. In more detail, FIG. 5A shows an example in which a defect is checked in the memory cell array 110, FIG. 5B shows an example in which a defect is checked in the plurality of peripheral logic circuits 150-1 to 150-N, and FIGS. 5C and 5D show examples in which defects are checked in the memory cell array 110 and the plurality of peripheral logic circuits 150-1 to 150-N.

Referring to FIG. 5A, a defect may be checked in the third column group BC [3] from among the first to fourth column groups BC [1] to BC [4] included in the memory cell array 110. For example, if the defect check logic circuit 160 of FIG. 1 checks a defect in at least one memory cell included in the third column group BC [3], the third column group BC [3] may be determined as a defective column.

When a defect is checked in the third column group BC [3], the path selection logic circuit 140 may form a path between the first column group BC [1] and the first peripheral logic circuit 150-1 and a path between the second column group BC [2] and the second peripheral logic circuit 150-2, as first paths. In more detail, based on the path control signal P_CTR, the first multiplexer 142_1 may select the first column group BC [1] from among the first and second column groups BC [1] and BC [2] connected to one end. Furthermore, based on the path control signal P_CTR, the second multiplexer 142_2 may select the second column group BC [2] from among the first to third column groups BC [1] to BC [3] connected to one end. In an exemplary embodiment of the inventive concept, the first and second multiplexers 142_1 and 142_2 may be in an initialized state.

In an exemplary embodiment of the inventive concept, the path selection logic circuit 140 may form paths between the fourth column group BC [4] and the third peripheral logic circuit 150-3 as first paths. In more detail, based on the path control signal P_CTR, the third multiplexer 142_3 may select the fourth column group BC [4] from among the second to fourth column groups BC [2] to BC [4] connected to one end.

In an exemplary embodiment of the inventive concept, the path selection logic circuit 140 may form paths between the fourth column group BC [4] and the third peripheral logic circuit 150-4 as first paths. In more detail, based on the path control signal P_CTR, the fourth multiplexer 142_4 may select the redundancy column group RD_BC, from among the third and fourth column groups BC [3] and BC [4] and the redundancy column group RD_BC connected to one end.

In an exemplary embodiment of the inventive concept, based on the path control signal P_CTR, the fifth multiplexer 142_5 may not select any of the fourth column group BC [4] and the redundancy column group RD_BC connected to one end.

Referring to FIG. 5B, a defect may be checked in the third peripheral logic circuit 150-3 from among the first to fourth peripheral logic circuits 150-1 to 150-4. For example, if the defect check logic circuit 160 of FIG. 1 checks a defect in at least one logic circuit included in the third peripheral logic circuit 150-3, the third peripheral logic circuit 150-3 may be determined as a defective peripheral logic circuit.

When a defect is checked in the third peripheral logic circuit 150-3, the path selection logic circuit 140 may form a path between the first column group BC [1] and the first peripheral logic circuit 150-1, and a path between the second column group BC [2] and the second peripheral logic circuit 150-2 as first paths. In more detail, based on the path control signal P_CTR, the first multiplexer 142_1 may select the first column group BC [1] from among the first and second column groups BC [1] and BC [2] connected to one end. Furthermore, based on the path control signal P_CTR, the second multiplexer 142_2 may select the second column group BC [2] from among the first to third column groups BC [1] to BC [3] connected to one end.

In an exemplary embodiment of the inventive concept, the path selection logic circuit 140 may form paths between the third column group BC [3] and the fourth peripheral logic circuit 150-4 as first paths. In more detail, based on the path control signal P_CTR, the fourth multiplexer 142_4 may select the third column group BC [3] from among the third column group BC [3], the fourth column group BC [4], and the redundancy column group RD_BC connected to one end.

In an exemplary embodiment of the inventive concept, the path selection logic circuit 140 may form paths between the fourth column group BC [4] and the redundancy peripheral logic circuit 150-5 as first paths. In more detail, based on the path control signal P_CTR, the fifth multiplexer 142_5 may select the fourth column group BC [4] from among the fourth column group BC [4] and the redundancy column group RD_BC connected to one end.

In an exemplary embodiment of the inventive concept, based on the path control signal P_CTR, the third multiplexer 142_3 may not select any of the second to fourth column groups BC [2] to BC [4] connected to one end.

Referring to FIG. 5C, a defect may be checked in the fourth column group BC [4] from among the first to fourth column groups BC [1] to BC [4]. Furthermore, a defect may be checked in the third peripheral logic circuit 150-3 from among the first to fourth peripheral logic circuits 150-1 to 150-4.

When defects are checked in the fourth column group BC [4] and the third peripheral logic circuit 150-3, the path selection logic circuit 140 may form a path between the first column group BC [1] and the first peripheral logic circuit 150-1 and a path between the second column group BC [2] and the second peripheral logic circuit 150-2, as first paths. In more detail, based on the path control signal P_CTR, the first multiplexer 142_1 may select the first column group BC [1] from among the first and second column groups BC [1] and BC [2] connected to one end. Furthermore, based on the path control signal P_CTR, the second multiplexer 142_2 may select the second column group BC [2] from among the first to third column groups BC [1] to BC [3] connected to one end.

In an exemplary embodiment of the inventive concept, the path selection logic circuit 140 may form paths between the third column group BC [3] and the fourth peripheral logic circuit 150-4 as first paths. In more detail, based on the path control signal P_CTR, the fourth multiplexer 142_4 may select the third column group BC [3] from among the third column group BC [3], the fourth column group BC [4], and the redundancy column group RD_BC connected to one end.

In an exemplary embodiment of the inventive concept, the path selection logic circuit 140 may form paths between the redundancy column group RD_BC and the redundancy peripheral logic circuit 150-5 as first paths. In more detail, based on the path control signal P_CTR, the fifth multiplexer 142_5 may select the redundancy column group RD_BC from among the fourth column group BC [4] and the redundancy column group RD_BC connected to one end.

In an exemplary embodiment of the inventive concept, based on the path control signal P_CTR, the third multiplexer 142_3 may not select any of the second to fourth column groups BC [2] to BC [4] connected to one end.

Referring to FIG. 5D, a defect may be checked in the third column group BC [3] from among the first to fourth column groups BC [1] to BC [4]. Furthermore, a defect may be checked in the fourth peripheral logic circuit 150-4 from among the first to fourth peripheral logic circuits 150-1 to 150-4.

When defects are checked in the third column group BC [3] and the fourth peripheral logic circuit 150-4, the path selection logic circuit 140 may form a path between the first column group BC [1] and the first peripheral logic circuit 150-1 and a path between the second column group BC [2] and the second peripheral logic circuit 150-2, as first paths. In more detail, based on the path control signal P_CTR, the first multiplexer 142_1 may select the first column group BC

[1] from among the first and second column groups BC [1] and BC [2] connected to one end. Furthermore, based on the path control signal P_CTR, the second multiplexer 142_2 may select the second column group BC [2] from among the first to third column groups BC [1] to BC [3] connected to one end.

In an exemplary embodiment of the inventive concept, the path selection logic circuit 140 may form paths between the fourth column group BC [4] and the third peripheral logic circuit 150-3 as first paths. In more detail, based on the path control signal P_CTR, the third multiplexer 142_3 may select the fourth column group BC [4] from among the second to fourth column groups BC [2] to BC [4] connected to one end.

In an exemplary embodiment of the inventive concept, the path selection logic circuit 140 may form paths between the redundancy column group RD_BC and the redundancy peripheral logic circuit 150-5 as first paths. In more detail, based on the path control signal P_CTR, the fifth multiplexer 142_5 may select the redundancy column group RD_BC from among the fourth column group BC [4] and the redundancy column group RD_BC connected to one end. In an exemplary embodiment of the inventive concept, based on the path control signal P_CTR, the fourth multiplexer 142_4 may not select any of the third column group BC [3], the fourth column group BC [4], and the redundancy column group RD_BC connected to one end.

Figure 6:
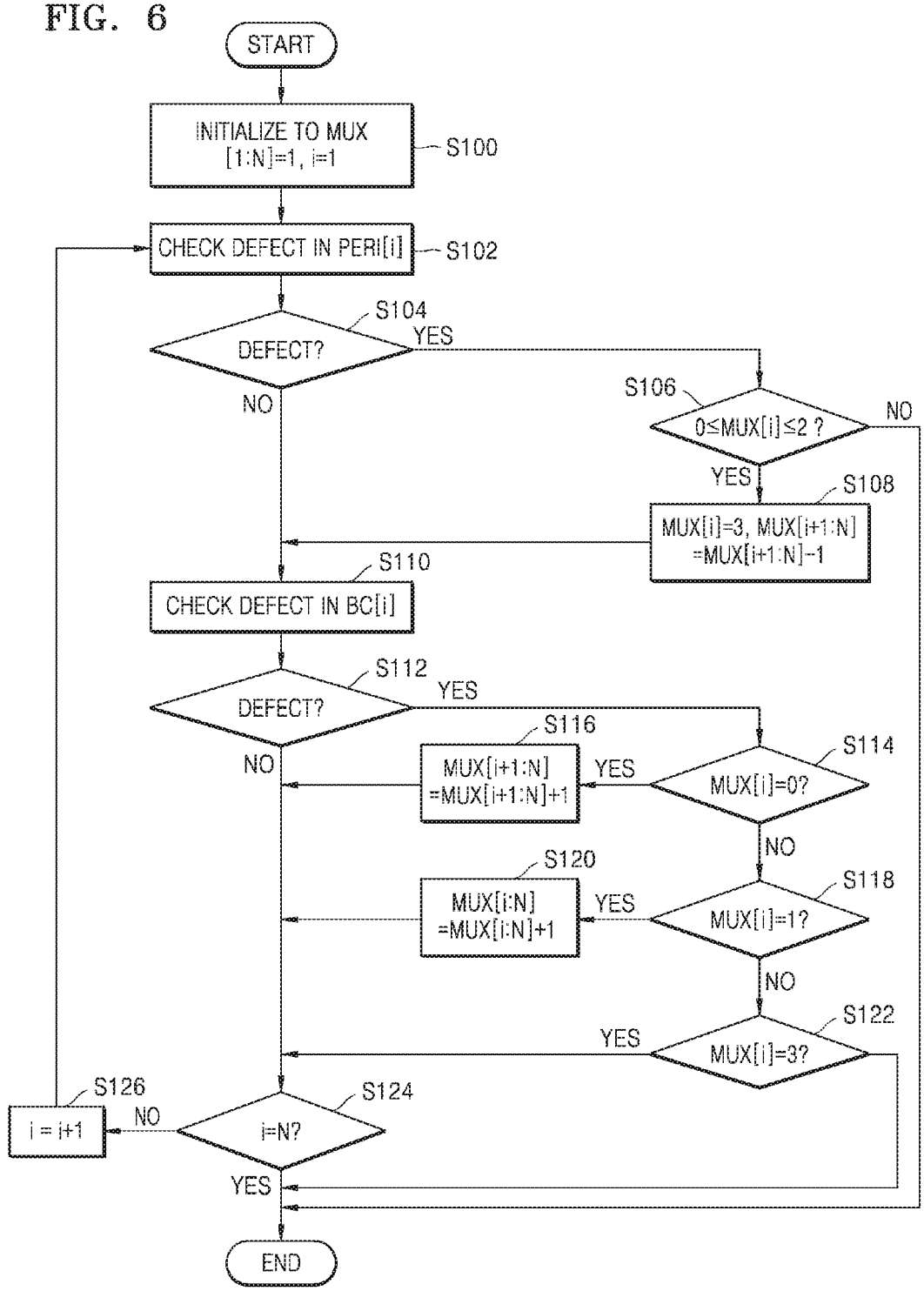
FIG. 6 is a flowchart of a method of operating the memory device of FIG. 1, according to an exemplary embodiment of the inventive concept.

FIG. 6 is a flowchart of a method of operating the memory device of FIG. 1, according to an exemplary embodiment of the inventive concept. The memory device may be, for example, the memory device 100 of FIG. 1.

Referring to FIGS. 1 and 6, in operation S100, selection values of first to $N^{th}$ multiplexers MUX[1:N] included in the path selection logic circuit 140 may be initialized. The selection values of the first to $N^{th}$ multiplexers MUX[1:N] may be, for example, values for alternatively selecting one of the plurality of column groups connected to one end of each multiplexer. In an exemplary embodiment of the inventive concept, the initialization of the selection values may be performed via the path control logic circuit 132. The path control logic circuit 132 may initialize the selection value of each of the first to $N^{th}$ multiplexers MUX[1:N] to 1, through the path control signal P_CTR.

In operation S102, a defect in an $i^{th}$ peripheral logic circuit PERI[i] may be checked. For example, 'i' may be sequentially increased from a natural number 1 to a natural number N. In an exemplary embodiment of the inventive concept, a defect in a peripheral logic circuit may be checked through, e.g., the detour circuit 153-1 of FIG. 2A and the defect check logic circuit 160 of FIG. 1.

In operation S104, it may be determined whether there is a defect in the $i^{th}$ peripheral logic circuit PERI[i]. In operation S110, if it is determined that there is no defect, a defect in an $i^{th}$ column group BC[i] may be checked. In operation S106, if it is determined that there is a defect, it may be determined whether a selection value of an $i^{th}$ multiplexer MUX[i] is a value between 0 and 2. For example, if the selection value of the $i^{th}$ multiplexer MUX[i] is not between 0 and 2, there may not be any redundancy peripheral logic circuits available. Therefore, in this case, the operation may be immediately terminated.

In operation S108, if the selection value of the $i^{th}$ multiplexer MUX[i] is between 0 and 2, the selection value of the $i^{th}$ multiplexer MUX[i] may be determined as 3, and each of the selection values from an $(i+1)^{th}$ multiplexer to the $N^{th}$ multiplexer MUX[i+1:N] may be determined to be a value obtained by subtracting 1 from a current selection value. For example, when a selection value from the $(i+1)^{th}$ multiplexer to the $N^{th}$ multiplexer MUX[i+1:N] is 1, which is an initialized value, each selection value may be determined to be '0' which is a value obtained by subtracting 1 from the initialized value.

As discussed above, in operation S110, the defect in the $i^{th}$ column group BC[i] included in the memory cell array 110 may be checked. In an exemplary embodiment of the inventive concept, a defect in a column group may be checked through the defect check logic circuit 160. When the defect in the column group is checked through the defect check logic circuit 160, the defect check logic circuit 160 may provide data to at least one memory cell included in a corresponding column and receive data output from the memory cell again. For example, when the data provided to the memory cell by the defect check logic circuit 160 is different from the data output from the memory cell again, the defect check logic circuit 160 may determine that there is a defect in the corresponding column including the memory cell.

In operation S112, it may be determined whether there is a defect in the $i^{th}$ column group BC[i]. In operation S124, if it is determined that there is no defect, it may be determined whether 'i' is equal to N.

In operation S114, if it is determined that there is a defect in the $i^{th}$ column group BC[i], it may be determined whether the selection value of the $i^{th}$ multiplexer MUX[i] is 0. In operation S116, if the selection value of the $i^{th}$ multiplexer MUX[i] is 0, each of the selection values from the $(i+1)^{th}$ multiplexer to the $N^{th}$ multiplexer MUX[i+1:N] may be determined to be a value obtained by adding 1 to a current selection value. For example, when the selection value from the $(i+1)^{th}$ multiplexer to the $N^{th}$ multiplexer MUX[i+1:N] is 1, which is an initialized value, each selection value may be determined to be 2 which is a value obtained by adding 1 to the initialized value.

In operation S118, if the selection value of the $i^{th}$ multiplexer MUX[i] is not 0, it may be determined whether the selection value is 1. In operation S120, if the selection value of the $i^{th}$ multiplexer MUX[i] is 1, each of the selection values from the $i^{th}$ multiplexer to the $N^{th}$ multiplexer MUX[i:N] may be determined to be a value obtained by adding 1 to a current selection value.

In operation S122, if the selection value of the $i^{th}$ multiplexer MUX[i] is not 1, it may be determined whether the selection value is 3. For example, if the selection value of the $i^{th}$ multiplexer MUX[i] is not 3, there may not be any available redundancy column groups left. Therefore, in this case, the operation may be immediately terminated.

As discussed above, in operation S124, if the selection value of the $i^{th}$ multiplexer MUX[i] is 3, it may be determined whether 'i' is equal to N. When 'i' reaches a value of N, the operation is terminated. In operation S126, if 'i' has not reached the value of N, a current value of 'i' is determined by increasing its value by 1, and operation S102 of checking a defect in the $i^{th}$ peripheral logic circuit PERI[i] may be performed again.

FIG. 6 shows the operations in an order for convenience of explanation, but the inventive concept is not limited thereto. For example, the order of the operations shown in FIG. 6 may be changed, or two or more operations may be performed in parallel.

Figure 7:
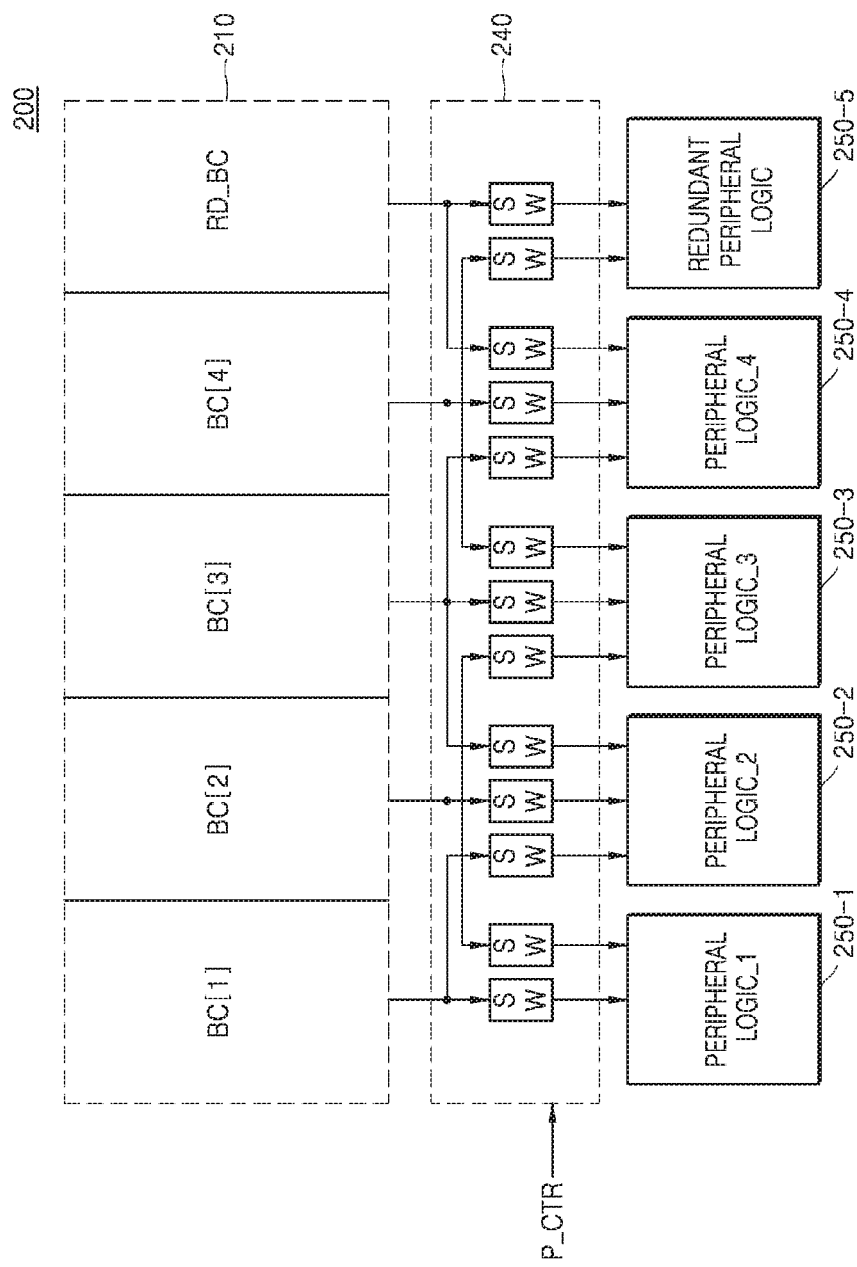
FIG. 7 is a block diagram of a memory device according to an exemplary embodiment of the inventive concept.

FIG. 7 is a block diagram of a memory device according to an exemplary embodiment of the inventive concept. A configuration of a memory device 200 of FIG. 7 is similar to that of the memory device 100 described with reference to FIG. 4. However, according to the present exemplary embodiment, a path selection logic circuit 240 may include a plurality of switches SW. In more detail, each of the plurality of switches SW may have one end connected to one of the first to fourth column groups BC [1] to BC [4] and the redundancy column group RD_BC included in a memory cell array 210, and the other end connected to one of peripheral logic circuits 250-1 to 250-5. The peripheral logic circuits 250-1 to 250-5 may include first to fourth peripheral logic circuits 250-1 to 250-4 and a redundant peripheral logic circuit 250-5. Each of the plurality of switches SW may include, for example, a p-channel metal-oxide-semiconductor (PMOS) or an n-channel metal-oxide-semiconductor (NMOS).

In an exemplary embodiment of the inventive concept, each of the plurality of switches SW may be turned on/off based on the path control signal P_CTR. When each of the plurality of switches SW includes a PMOS or NMOS, the path control signal P_CTR may be applied to a gate voltage of each of the plurality of switches SW. For example, the path control signal P_CTR may be one of turn-on and turn-off voltages of each of the plurality of switches SW.

The path control signal P_CTR may be output, for example, from the path control logic circuit 132 of FIG. 1. The path control logic circuit 132 may control a turn-on/turn-off of each of the plurality of switches SW according to the path control signal P_CTR to determine first paths formed between the column groups (the first to fourth column groups BC [1] to BC [4] and the redundancy column group RD_BC) and the peripheral logic circuits 250-1 to 250-5.

Figure 8:
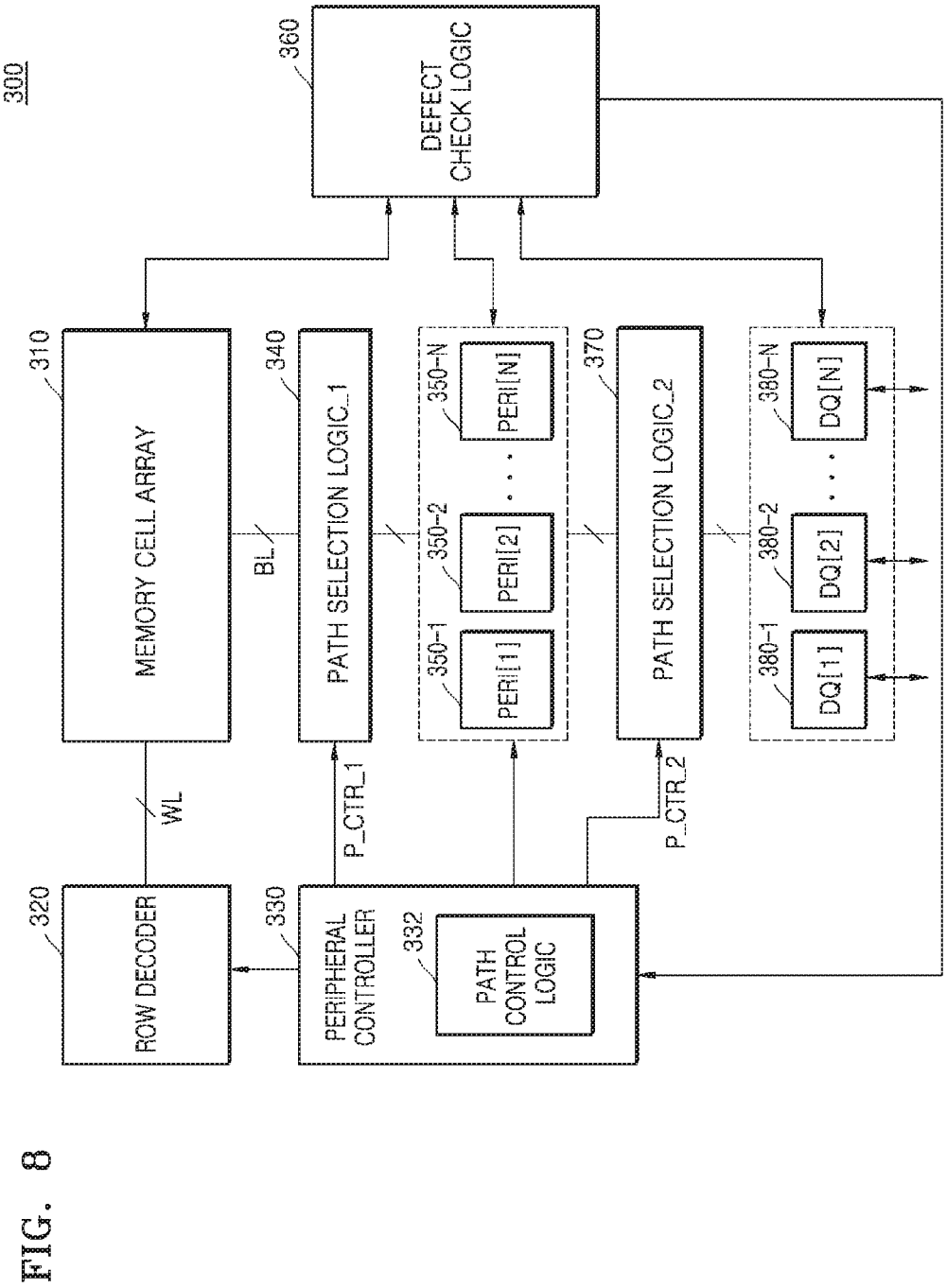
FIG. 8 is a block diagram of a memory device according to an exemplary embodiment of the inventive concept.

FIG. 8 is a block diagram of a memory device according to an exemplary embodiment of the inventive concept. Referring to FIG. 8, a memory device 300 may include a memory cell array 310, a row decoder 320, a peripheral logic controller 330, a first path selection logic circuit 340, a plurality of peripheral logic circuits 350-1 to 350-N, a defect check logic circuit 360, a second path selection logic circuit 370, and a plurality of DQ logic circuits 380-1 to 380-N.

In FIG. 8, the first path selection logic circuit 340 and a first path control signal P_CTR_1 may correspond to, for example, the path selection logic circuit 140 and the path control signal P_CTR of FIG. 1. Repeat descriptions of other blocks of the memory device 300 that are similar to those described with reference to FIG. 1 will not be given herein.

The second path selection logic circuit 370 may form second paths between the plurality of peripheral logic circuits 350-1 to 350-N and the plurality of DQ logic circuits 380-1 to 380-N based on a second path control signal P_CTR_2 output from a path control logic circuit 332 included in the peripheral logic controller 330. The second paths may, for example, refer to paths of data or signals between the plurality of peripheral logic circuits 350-1 to 350-N and the plurality of DQ logic circuits 380-1 to 380-N.

In an exemplary embodiment of the inventive concept, the second path selection logic circuit 370 may form, as at least a portion of the second paths, one of paths formed between a first peripheral logic circuit from among the plurality of peripheral logic circuits 350-1 to 350-N and a first DQ logic circuit from among the plurality of DQ logic circuits 380-1 to 380-N, paths formed between the first peripheral logic circuit and a second DQ logic circuit adjacent to one side of the first DQ logic circuit, and paths formed between the first peripheral logic circuit and a third DQ logic circuit adjacent to the other side of the first DQ logic circuit.

In an exemplary embodiment of the inventive concept, the second path selection circuit 370 may include a plurality of multiplexers connected to the plurality of peripheral logic circuits 350-1 to 350-N and the plurality of DQ logic circuits 380-1 to 380-N. In an exemplary embodiment of the inventive concept, the second path selection circuit 370 may include a plurality of switches connected to the plurality of peripheral logic circuits 350-1 to 350-N and the plurality of DQ logic circuits 380-1 to 380-N. However, the inventive concept is not limited thereto. For example, the second path selection logic circuit 370 may include a shift register.

The plurality of DQ logic circuits 380-1 to 380-N may receive signals output from the plurality of peripheral logic circuits 350-1 to 350-N and transmit the signals to the outside of the memory device 300. Furthermore, the plurality of DQ logic circuits 380-1 to 380-N may receive signals input from outside the memory device 300 and transmit the signals to the plurality of peripheral logic circuits 350-1 to 350-N. In addition, the plurality of DQ logic circuits 380-1 to 380-N may perform a buffering operation on the received input/output signals.

In an exemplary embodiment of the inventive concept, each of the plurality of DQ logic circuits 380-1 to 380-N may include a detour circuit that is controlled by the defect check logic circuit 360, receives a detour signal from the defect check logic circuit 360, and outputs the received detour signal to at least one logic circuit included in each of the plurality of DQ logic circuits 380-1 to 380-N. In an exemplary embodiment of the inventive concept, the detour signal output by each detour circuit may be an index of a defect check for each of the plurality of DQ logic circuits 380-1 to 380-N.

For example, the detour circuit included in each of the plurality of DQ logic circuits 380-1 to 380-N may be implemented in a form of a switch, a transmission gate, a metal-oxide-semiconductor field effect transistor (MOSFET), a fuse circuit, or the like. In other words, the detour circuit may be implemented in any form as long as it is capable of signal transmission.

In an exemplary embodiment of the inventive concept, each of the plurality of DQ logic circuits 380-1 to 380-N may include a normal DQ logic circuit and a redundancy DQ logic circuit. The redundancy DQ logic circuit may be an extra peripheral logic circuit for repairing the normal DQ logic circuit. For example, if a defect occurs in one DQ logic circuit, one redundancy DQ logic circuit may form a data path with one of the plurality of peripheral logic circuits 350-1 to 350-N.

Figure 9:
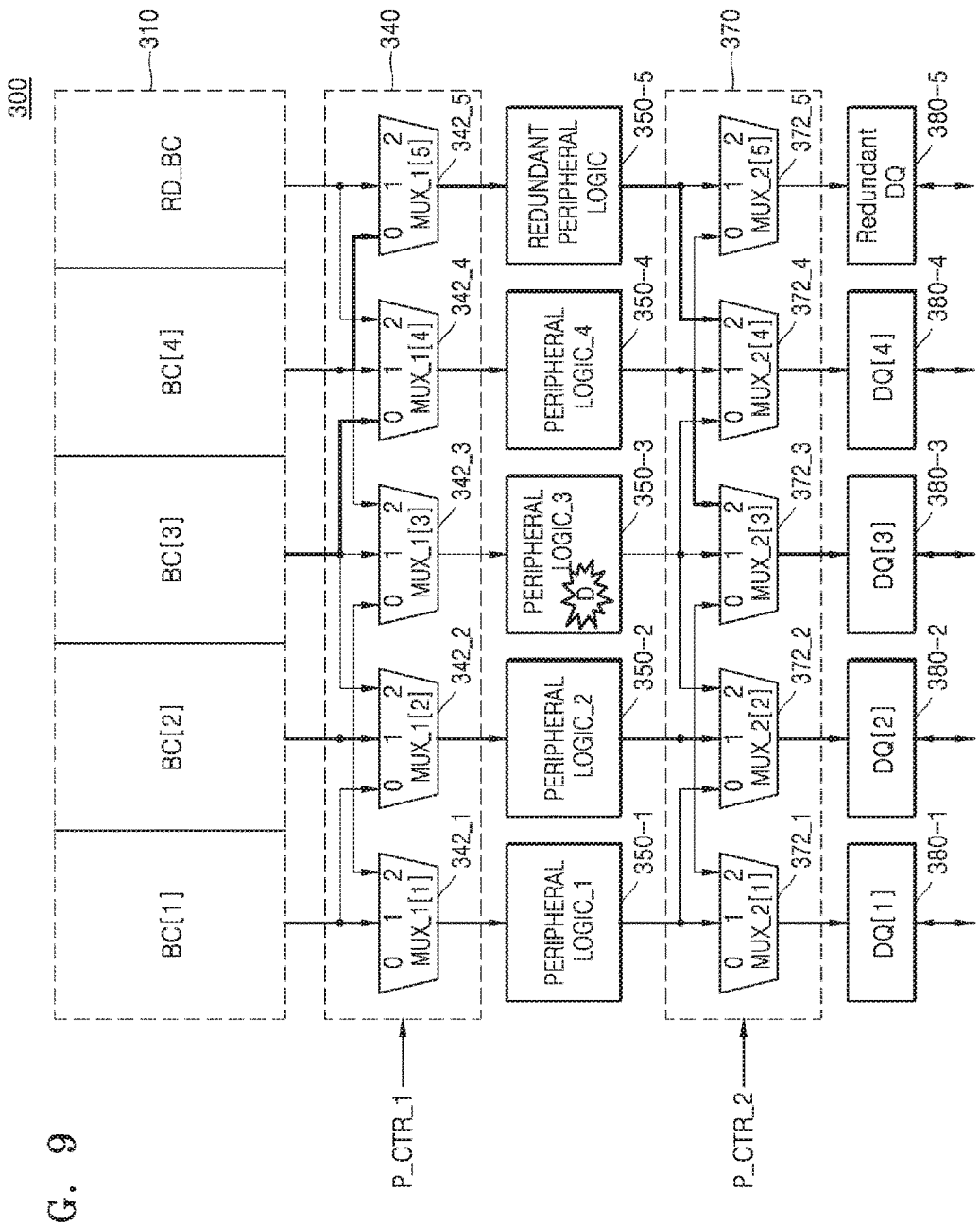
FIG. 9 is a view for explaining an operation of a path selection logic circuit of FIG. 8 when checking a defect, according to an exemplary embodiment of the inventive concept.

FIG. 9 is a view for explaining an operation of a path selection logic circuit of FIG. 8 when checking a defect, according to an exemplary embodiment of the inventive concept. FIG. 9 shows a case where a defect is checked in a third peripheral logic circuit 350-3 among first to fourth peripheral logic circuits 350-1 to 350-4 and a redundant peripheral logic circuit 350-5. For example, if the defect check logic circuit 360 of FIG. 8 checks a defect in at least one logic circuit included in the third peripheral logic circuit 350-3, the third peripheral logic circuit 350-3 may be determined as a defective peripheral logic circuit.

Referring to FIG. 9, the memory device 300 may include first to fourth DQ logic circuits 380-1 to 380-4 and a redundancy DQ logic circuit 380-5. Although FIG. 9 shows four DQ logic circuits and one redundancy DQ logic circuit, this is for convenience of explanation, and the number of DQ logic circuits and redundancy DQ logic circuits is not limited thereto.

In FIG. 9, the first path selection logic circuit 340 may include first to fifth multiplexers 342_1 to 342_5. The first path selection logic circuit 340 and the first path control signal P_CTR_1 may perform an operation corresponding to, for example, the path selection logic circuit 140 and the path control signal P_CTR of FIG. 5B. Repeat descriptions of other blocks of the memory device 300 similar to those described with reference to FIG. 5B will not be given herein.

The second path selection logic circuit 370 may include first to fifth multiplexers 372_1 to 372_5. Each of the first to fifth multiplexers 372_1 to 372_5 may have one end connected to at least two of the plurality of peripheral logic circuits 350-1 to 350-5 and the other end connected to one of the plurality of DQ logic circuits 380-1 to 380-5.

In an exemplary embodiment of the inventive concept, one end of the first multiplexer 372_1 may be connected to the first peripheral logic circuit 350-1 and the second peripheral logic circuit 350-2, and the other end may be connected to the first DQ logic circuit 380-1. One end of the second multiplexer 372_2 may be connected to the first to third peripheral logic circuits 350-1 to 350-3, and the other end may be connected to the second DQ logic circuit 380-2. One end of the third multiplexer 372_3 may be connected to the second to fourth peripheral logic circuits 350-2 to 350-4, and the other end may be connected to the third DQ logic circuit 380-3. One end of the fourth multiplexer 372_4 may be connected to the third and fourth peripheral logic circuits 350-3 and 350-4 and the redundancy peripheral logic circuit 350-5, and the other end may be connected to the fourth DQ logic circuit 380-4. One end of the fifth multiplexer 372_5 may be connected to the fourth peripheral logic circuit 350-4 and the redundancy peripheral logic circuit 350-5, and the other end may be connected to the redundancy DQ logic circuit 380-5.

In an exemplary embodiment of the inventive concept, the first to fifth multiplexers 372_1 to 372_5 included in the second path selection logic circuit 370 may select one of the peripheral logic circuits connected thereto based on the second path control signal P_CTR_2 output from the path control logic circuit 332 of FIG. 8. For example, the second path control signal P_CTR_2 may include a plurality of bits for selection of each of the first to fifth multiplexers 372_1 to 372_5.

For example, when defects are checked in the third peripheral logic circuit 350-3 and the fourth DQ logic circuit 380-4, the second path selection logic circuit 370 may form a path between the first peripheral logic circuit 350-1 and the first DQ logic circuit 380-1 and a path between the second peripheral logic circuit 350-2 and the second DQ logic circuit 380-2, as second paths. In more detail, based on the second path control signal P_CTR_2, the first multiplexer 372_1 may select the first peripheral logic circuit 350-1 from among the first and second peripheral logic circuits 350-1 and 350-2 connected to one end. Furthermore, based on the second path control signal P_CTR_2, the second multiplexer 372_2 may select the second peripheral logic circuit 350-2 from among the first to third peripheral logic circuits 350-1 to 350-3 connected to one end.

In an exemplary embodiment of the inventive concept, the second path selection logic circuit 370 may form a path between the fourth peripheral logic circuit 350-4 and the third DQ logic circuit 380-3 as second paths. In more detail, based on the second path control signal P_CTR_2, the third multiplexer 372_3 may select the fourth peripheral logic circuit 350-4 from among the second to fourth peripheral logic circuits 350-2 to 350-4 connected to one end.

In an exemplary embodiment of the inventive concept, the second path selection logic circuit 370 may form a path between the redundancy peripheral logic circuit 350-5 and the fourth DQ logic circuit 380-4 as second paths. In more detail, based on the second path control signal P_CTR_2, the fourth multiplexer 372_4 may select the fourth peripheral logic circuit 350-4 from among the fourth peripheral logic circuit 350-4 and the redundancy peripheral logic circuit 350-5 connected to one end.

In an exemplary embodiment of the inventive concept, based on the second path control signal P_CTR_2, the fifth multiplexer 372_5 may not select any of the fourth peripheral logic circuit 350-4 and the redundancy peripheral logic circuit 350-5 connected to one end.

Figure 10:
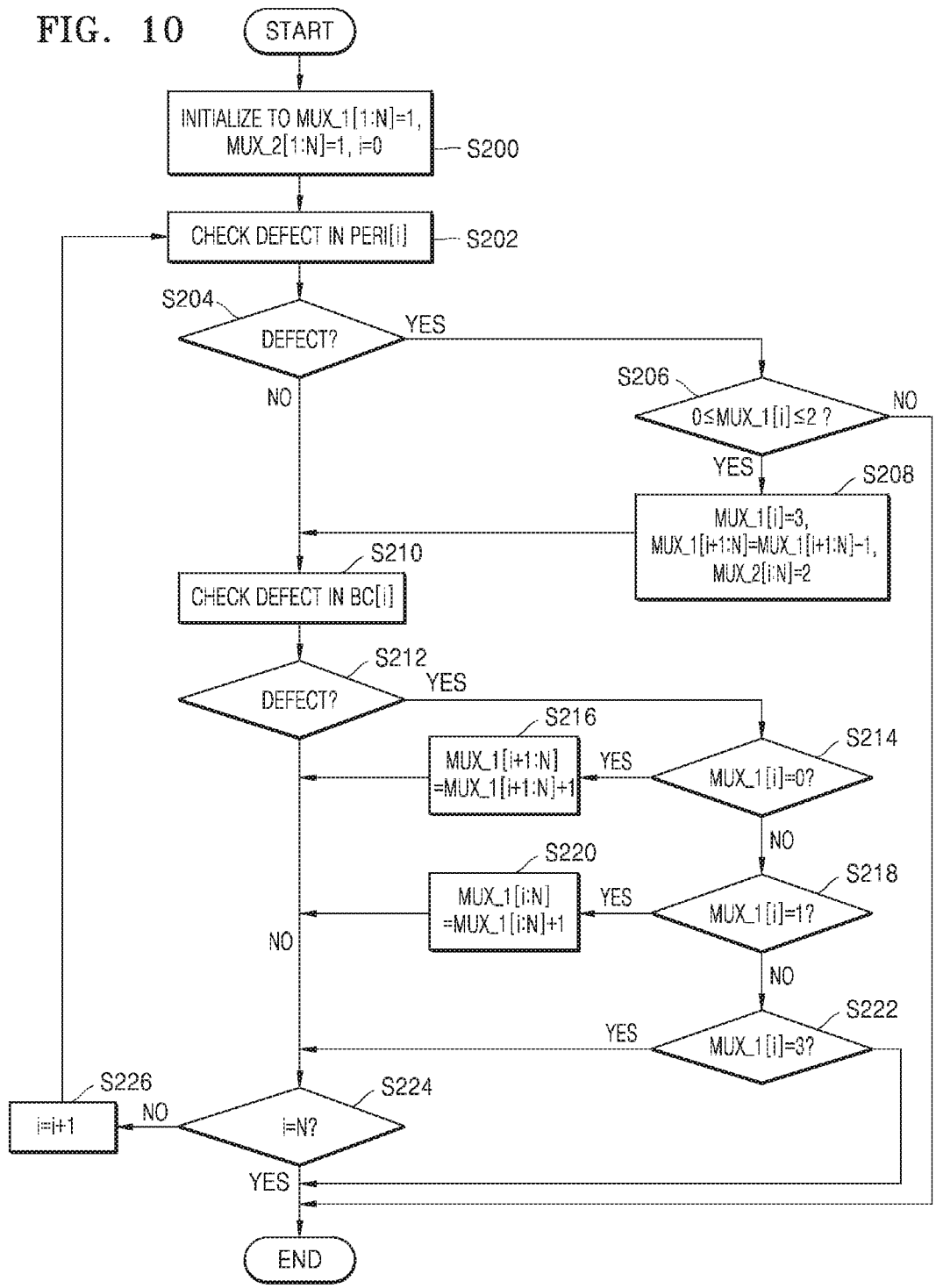
FIG. 10 is a flowchart of a method of operating the memory device of FIG. 8, according to an exemplary embodiment of the inventive concept.

FIG. 10 is a flowchart of a method of operating the memory device of FIG. 8, according to an exemplary embodiment of the inventive concept. The memory device may be, for example, the memory device 300 of FIG. 8. Repeat descriptions of operations in the method of operating the memory device 300 that are similar to those described with reference to FIG. 1 will not be given herein.

Referring to FIGS. 8 and 10, in operation S200, selection values of first to $N^{th}$ multiplexers MUX_1[1:N] included in the first path selection logic circuit 340 and first to $N^{th}$ multiplexers MUX_2[1:N] included in the second path selection logic circuit 370 may be initialized. In an exemplary embodiment of the inventive concept, the initialization of the selection values may be performed via the path control logic circuit 332. The path control logic circuit 332 may initialize the selection value of each of the first to $N^{th}$ multiplexers MUX_1[1:N] included in the first path selection logic circuit 340 to '1' through the first path control signal P_CTR_1. Furthermore, the path control logic circuit 332 may initialize the selection value of each of the first to $N^{th}$ multiplexers MUX_2[1:N] included in the second path selection logic circuit 370 to '1' through the second path control signal P_CTR_2.

Thereafter, in operation S202, a defect in the $i^{th}$ peripheral logic circuit PERI[i] is checked, and in operation S204, it may be determined whether there is a defect in the $i^{th}$ peripheral logic circuit PERI[i]. In operation S210, if it is determined that there is no defect, a defect in the $i^{th}$ column group BC[i] may be checked.

In operation S206, if it is determined that there is a defect, it may be determined whether a selection value of an $i^{th}$ multiplexer MUX_1[i] of the first path selection logic circuit 340 is a value between 0 and 2. In operation S208, if the selection value of the $i^{th}$ multiplexer MUX_1[i] of the first path selection logic circuit 340 is a value between 0 and 2, the selection value of the $i^{th}$ multiplexer MUX_1[i] of the first path selection logic circuit 340 may be determined as 3, each of selection values from an $(i+1)^{th}$ multiplexer to an $N^{th}$ multiplexer MUX_1[i+1:N] may be determined to be a value obtained by subtracting 1 from a current selection value, and a selection value from the $i^{th}$ multiplexer to the $N^{th}$ multiplexer MUX_2[i:N] of the second path selection logic circuit 370 may be determined as 2.

Operations S210, S212, S214, S216, S218, S220, S222, S224, and S226 in FIG. 10 may be similar to operations S110, S112, S114, S116, S118, S120, S122, S124, and S126 in FIG. 6, and thus descriptions thereof will be omitted.

Figure 11:
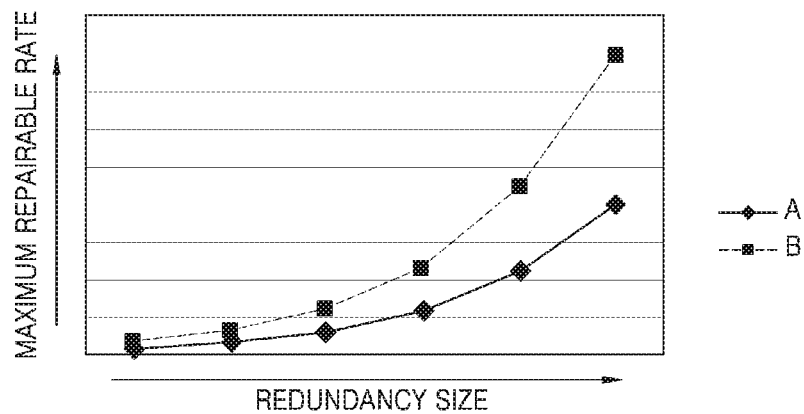
FIG. 11 is a graph of a ratio of repairable normal memory to a size of a redundancy memory of a memory device according to an exemplary embodiment of the inventive concept.

FIG. 11 is a graph of a ratio of repairable normal memory to a size of a redundancy memory of a memory device according to an exemplary embodiment of the inventive concept. An X-axis of the graph indicates the size of the redundancy memory, and the size may become larger towards an arrow direction of the X-axis. A Y-axis indicates the maximum rate of a repairable memory, and the rate may become larger towards an arrow direction of the Y-axis.

Referring to FIG. 11, graph A may indicate a ratio of repairable normal memory to a size of a redundancy memory of a memory device according to a comparative example. Graph B may indicate the ratio of repairable normal memory to the size of the redundancy memory of the memory device according to an exemplary embodiment of the inventive concept.

In both graphs A and B, as the size of the redundancy memory becomes larger, the ratio of the repairable normal memory to the size of the redundancy memory may gradually increase. However, in comparison with the comparative example, the memory device according to an exemplary embodiment of the inventive concept may be independently repaired in each of a memory cell array and peripheral logic circuits therein. Thus, when defects occur in at least one of the memory cell array and the peripheral logic circuits, efficiency of the repair may be increased. In other words, as the size of the redundancy memory becomes larger, the memory device according to an exemplary embodiment of the inventive concept may have a larger increase in the ratio of the repairable normal memory to the size of the redundancy memory, as compared to the memory device in the comparative example (e.g., a conventional memory device).

Figure 12:
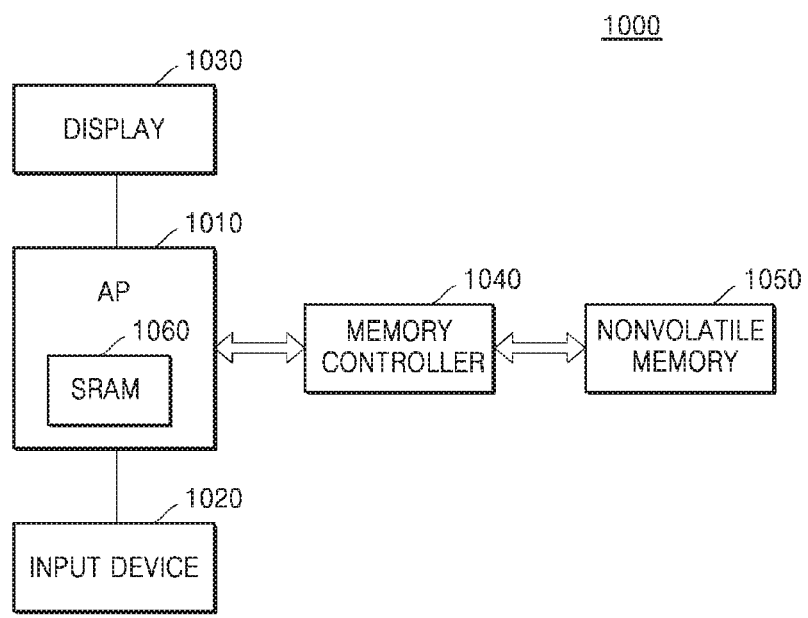
FIG. 12 is a view of an electronic system including a memory device, according to an exemplary embodiment of the inventive concept.

FIG. 12 is a view of an electronic system including a memory device, according to an exemplary embodiment of the inventive concept. An electronic system 1000 in FIG. 12 may be implemented as a personal computer (PC), a smartphone, a tablet PC, a netbook, an e-reader, a personal digital assistant (PDA), a portable multimedia player (PMP), an MP3 player, an MP4 player, etc.

The electronic system 1000 may include an application processor 1010 that can control general operations of the electronic system 1000. The application processor 1010 may be, for example, a system-on-chip (SOC). The application processor 1010 may display data, stored in a nonvolatile memory device 1050, via a display 1030, according to data input through an input device 1020. For example, the input device 1020 may be implemented as a pointing device (e.g., a touch pad or a computer mouse), a keypad, or a keyboard.

The application processor 1010 may include static random access memory (SRAM) 1060 that can store received data. As described above, the SRAM 1060 according to an exemplary embodiment of the inventive concept may include a first path selection logic circuit to form first paths between a plurality of columns and a plurality of peripheral logic circuits, based on at least one defect from among a defect in at least one of the plurality of columns or a defect in at least one of the plurality of peripheral logic circuits.

Furthermore, the electronic system 1000 may include a memory controller 1040 that can control data processing operations of the nonvolatile memory device 1050. For example, the memory controller 1040 may be implemented as a portion of the application processor 1010, or may be implemented as a separate chip from the application processor 1010.

While the inventive concept has been shown and described with reference to exemplary embodiments thereof, it will be understood by those of ordinary skill in the art that various changes in form and details may be made thereto without departing from the spirit and scope of the inventive concept as set forth in the following claims.

What is claimed is:

1. A memory device comprising:
a memory cell array including a plurality of memory cells arranged in a plurality of columns including a normal column and a redundancy column for repairing the normal column;
a plurality of peripheral logic circuits including a normal peripheral logic circuit and a redundancy peripheral logic circuit for repairing the normal peripheral logic circuit; and
a first path selection logic circuit configured to form first paths between the plurality of columns and the plurality of peripheral logic circuits, based on at least one defect from among a defect in at least one of the plurality of columns or a defect in at least one of the plurality of peripheral logic circuits.

2. The memory device of claim 1, wherein
the first path selection logic circuit is configured to form, as at least a portion of the first paths, one of paths formed between first columns from among the plurality of columns and a first peripheral logic circuit from among the plurality of peripheral logic circuits, paths formed between the first columns and a second peripheral logic circuit adjacent to one side of the first peripheral logic circuit, and paths formed between the first columns and a third peripheral logic circuit adjacent to the other side of the first peripheral logic circuit.

3. The memory device of claim 1, wherein
the first path selection logic circuit includes a plurality of multiplexers connected to the plurality of columns and the plurality of peripheral logic circuits.

4. The memory device of claim 3, wherein
the plurality of columns includes first columns, second columns adjacent to one side of the first columns, and third columns adjacent to the other side of the first columns, and
the plurality of multiplexers include a first multiplexer configured to connect the first columns, the second columns, or the third columns to a first peripheral logic circuit from among the plurality of peripheral logic circuits.

5. The memory device of claim 1, further comprising:
a defect check logic circuit configured to check a defect in at least one of the plurality of columns and a defect in at least one of the plurality of peripheral logic circuits to output a defect check signal; and
a path control logic circuit configured to output a path control signal to control the first path selection logic circuit in response to the defect check signal.

6. The memory device of claim 5, wherein
each of the plurality of peripheral logic circuits includes a detour circuit configured to receive a detour signal from the defect check logic circuit, and output the received detour signal to at least one logic circuit included therein in response to control by the defect check logic circuit.

7. The memory device of claim 1, further comprising:
a plurality of DQ logic circuits including a normal DQ logic circuit and a redundancy DQ logic circuit for repairing the normal DQ logic circuit, and configured to receive signals output from the plurality of peripheral logic circuits or signals input from outside the memory device; and
a second path selection logic circuit configured to form second paths between the plurality of peripheral logic circuits and the plurality of DQ logic circuits, based on at least one defect from among a defect in at least one of the plurality of peripheral logic circuits or a defect in at least one of the plurality of DQ logic circuits.

8. The memory device of claim 7, wherein
the second path selection logic circuit is configured to form, as at least a portion of the second paths, one of paths formed between a first peripheral logic circuit from among the plurality of peripheral logic circuits and a first DQ logic circuit from among the plurality of DQ logic circuits, paths formed between the first peripheral logic circuit and a second DQ logic circuit adjacent to one side of the first DQ logic circuit, and paths formed between the first peripheral logic circuit and a third DQ logic circuit adjacent to the other side of the first DQ logic circuit.

9. The memory device of claim 7, wherein
the second path selection logic circuit includes a plurality of multiplexers connected to the plurality of peripheral logic circuits and the plurality of DQ logic circuits.

10. The memory device of claim 9, wherein
the plurality of peripheral logic circuits includes a first peripheral logic circuit, a second peripheral logic circuit adjacent to one side of the first peripheral logic circuit, and a third peripheral logic circuit adjacent to the other side of the first peripheral logic circuit, and
the plurality of multiplexers include a first multiplexer configured to connect the first peripheral logic circuit, the second peripheral logic circuit, or the third peripheral logic circuit to a first DQ logic circuit from among the plurality of DQ logic circuits.

11. A memory device comprising:
a memory cell array including a plurality of memory cells arranged in a plurality of columns including a normal column and a redundancy column for repairing the normal column;
a plurality of peripheral logic circuits including a normal peripheral logic circuit and a redundancy peripheral logic circuit for repairing the normal peripheral logic circuit; and
a path control logic circuit configured to output a path control signal determining first paths formed between the plurality of columns and the plurality of peripheral logic circuits, based on at least one defect from among a defect in at least one of the plurality of columns or a defect in at least one of the plurality of peripheral logic circuits.

12. The memory device of claim 11, wherein
the path control logic circuit is configured to determine, as at least a portion of the first paths, one of paths formed between first columns from among the plurality of columns and a first peripheral logic circuit from among the plurality of peripheral logic circuits, paths formed between the first columns and a second peripheral logic circuit adjacent to one side of the first peripheral logic circuit, and paths formed between the first columns and a third peripheral logic circuit adjacent to the other side of the first peripheral logic circuit.

13. The memory device of claim 11, further comprising:
a first path selection logic circuit configured to form the first paths between the plurality of columns and the plurality of peripheral logic circuits in response to the path control signal.

14. The memory device of claim 11, further comprising:
a plurality of DQ logic circuits including a normal DQ logic circuit and a redundancy DQ logic circuit for repairing the normal DQ logic circuit, and configured to receive signals output from the plurality of peripheral logic circuits or signals input from outside the memory device,
wherein second paths are formed between the plurality of peripheral logic circuits and the plurality of DQ logic circuits.

15. The memory device of claim 14, wherein
the path control logic circuit is configured to further determine the second paths based on at least one defect from among a defect in at least one of the plurality of peripheral logic circuits or a defect in at least one of the plurality of DQ logic circuits.

16. A method of operating a memory device including a memory cell array, a path selection logic circuit, and a plurality of peripheral logic circuits, wherein the memory cell array includes a plurality of column groups and the path selection logic circuit includes a plurality of multiplexers, and each of the plurality of multiplexers is configured to select an input from one of at least two of the plurality of column groups and output to one of the plurality of peripheral logic circuits, the method comprising:
checking for a defect in a first peripheral logic circuit among the plurality of peripheral logic circuits;
controlling the plurality of multiplexers to adjust input selections thereof when it is determined that there is a defect in the first peripheral logic circuit;
checking for a defect in a first column group among the plurality of column groups; and
controlling the plurality of multiplexers to adjust the input selections thereof when it is determined that there is a defect in the first column group.

17. The method of claim 16, wherein the plurality of column groups includes a normal column group and a redundancy column group for repairing the normal column group, and
the plurality of peripheral logic circuits includes a normal peripheral logic circuit and a redundant peripheral logic circuit for repairing the normal peripheral logic circuit.

18. The method of claim 16, wherein the plurality of multiplexers includes a first multiplexer and a second multiplexer,
the first multiplexer is configured to select an input from the first column group and to output to the first peripheral logic circuit, and
controlling the plurality of multiplexers when it is determined that there is a defect in the first peripheral logic circuit comprises:
controlling the first multiplexer to not select any inputs; and
controlling the second multiplexer to select the input from the first column group.

19. The method of claim 16, wherein the plurality of multiplexers includes a first multiplexer,
the first multiplexer is configured to select an input from the first column group, a second column group, or a third column group among the plurality of column groups, and
controlling the plurality of multiplexers when it is determined that there is a defect in the first column group comprises:
controlling the first multiplexer to select the input from the second column group that was previously determined to have no defects or the third column group to be checked for defects.

20. The method of claim 16, wherein a selection value of each of the plurality of multiplexers is initialized to select one of the plurality of column groups connected thereto prior to checking defects in the plurality of peripheral logic circuits and the plurality of column groups, and
the plurality of peripheral logic circuits and the plurality of column groups are checked for defects in sequential order.

* * * * *